United States Patent
Kumar et al.

(10) Patent No.: US 9,881,800 B2
(45) Date of Patent: Jan. 30, 2018

(54) STRUCTURE AND METHOD FOR HIGH PERFORMANCE LARGE-GRAIN-POLY SILICON BACKPLANE FOR OLED APPLICATIONS

(71) Applicants: Ananda H. Kumar, Fremont, CA (US); Srinivas H. Kumar, Fremont, CA (US); Tue Nguyen, Fremont, CA (US)

(72) Inventors: Ananda H. Kumar, Fremont, CA (US); Srinivas H. Kumar, Fremont, CA (US); Tue Nguyen, Fremont, CA (US)

( * ) Notice: Subject to any disclaimer, the term of this patent is extended or adjusted under 35 U.S.C. 154(b) by 0 days.

(21) Appl. No.: 15/368,524

(22) Filed: Dec. 2, 2016

(65) Prior Publication Data

US 2017/0162388 A1   Jun. 8, 2017

Related U.S. Application Data

(60) Provisional application No. 62/261,880, filed on Dec. 2, 2015, provisional application No. 62/262,358, filed on Dec. 2, 2015, provisional application No. 62/262,361, filed on Dec. 2, 2015.

(51) Int. Cl.
*H01L 21/00* (2006.01)
*H01L 21/306* (2006.01)
*H01L 21/265* (2006.01)
*H01L 21/266* (2006.01)

(52) U.S. Cl.
CPC ...... *H01L 21/30604* (2013.01); *H01L 21/266* (2013.01); *H01L 21/26506* (2013.01)

(58) Field of Classification Search
None
See application file for complete search history.

(56) References Cited

U.S. PATENT DOCUMENTS

| 2004/0087111 A1* | 5/2004 | Iwasaki | H01L 21/76254 438/458 |
| 2012/0329243 A1* | 12/2012 | Letertre | H01L 21/76254 438/458 |
| 2016/0049324 A1* | 2/2016 | Yamaguchi | C08L 33/08 257/618 |

* cited by examiner

*Primary Examiner* — Angel Roman
(74) *Attorney, Agent, or Firm* — Tue Nguyen

(57) ABSTRACT

Large grain polysilicon films can be exfoliated on a handle substrate, such as a glass or glass-ceramic substrate. The large grain polysilicon can have high mobility for device formation, and can be used for backplane of a display or a sensor array for x-ray detection.

10 Claims, 24 Drawing Sheets

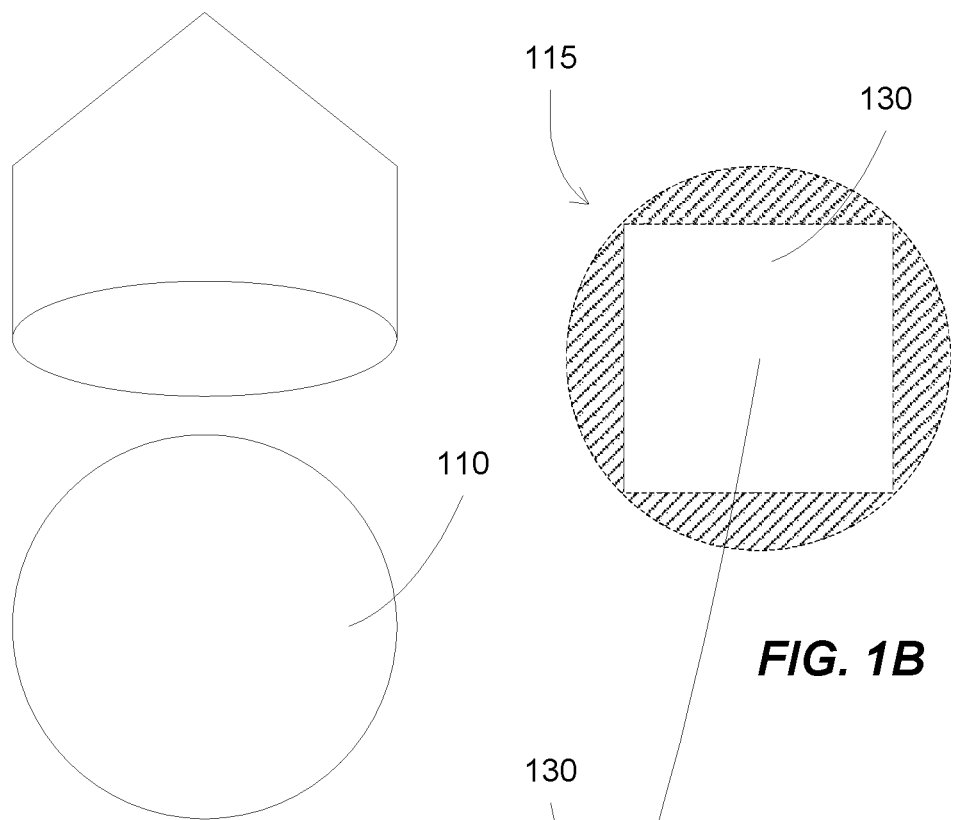
FIG. 1B
FIG. 1A
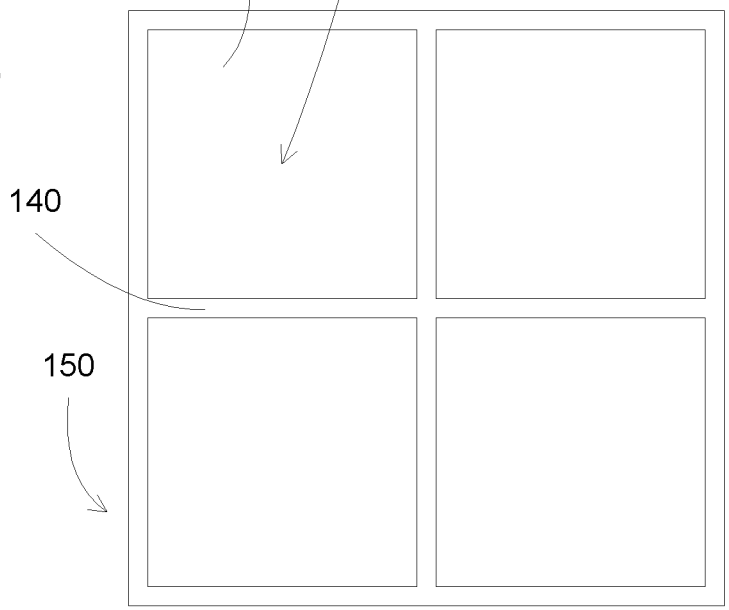
FIG. 1C

Exfoliating a thin film of polysilicon on a substrate such as a glass or glass-ceramic substrate
400

FIG. 4A

Providing a polysilicon substrate
420

Selecting a glass or glass-ceramic substrate, wherein the glass or glass-ceramic substrate has a similar dimension as the polysilicon substrate
430

Exfoliating a layer from the polysilicon substrate onto the glass or glass-ceramic substrate
440

FIG. 4B

Forming a defect plane under a polysilicon substrate
460

Transferring a layer of the polysilicon substrate formed by the defect plane onto a glass or glass-ceramic substrate
470

FIG. 4C

Selectively implanting a portion of a silicon substrate, wherein the silicon substrate comprises a single crystal silicon or a polysilicon substrate
1800

Exfoliating the portion of the silicon substrate on a handle substrate
1810

*FIG. 18A*

Forming a mask on a silicon substrate, wherein the silicon substrate comprises a single crystal silicon or a polysilicon substrate
1830

Ion implanting the silicon substrate through the mask
1840

Removing the mask
1850

Exfoliating a portion of a silicon layer on a handle substrate, wherein the silicon layer is formed by the mask
1860

*FIG. 18B*

Transferring multiple portions of a silicon substrate to a handle substrate, wherein the pitch of the multiple portions in the silicon substrate is different from the pitch in the handle substrate
2100

FIG. 21A

Exfoliating one or more portions of a silicon substrate to a handle substrate
2120

Repeatingly exfoliating another one or more portions
2130

FIG. 21B

Exfoliating a portion of a silicon substrate on a handle substrate using a conformal loading
2300

FIG. 23A

Exfoliating a first portion of a silicon substrate on a handle substrate, wherein the portion is disposed near a second silicon portion on the handle substrate, wherein the exfoliating process is configured so that the first and second portions are placed edges to edges
2320

FIG. 23B

Exfoliating a first portion of a first silicon substrate to a handle substrate
2340

Exfoliating a second portion of a second silicon substrate on the handle substrate, wherein the second portion is disposed near the first portion, wherein a conformal loading is used in the exfoliating process
2350

Removing overlap portions from the first and second portions
2360

FIG. 23C

STRUCTURE AND METHOD FOR HIGH PERFORMANCE LARGE-GRAIN-POLY SILICON BACKPLANE FOR OLED APPLICATIONS

The present application claims priority from U.S. Provisional Patent Application Ser. No. 62/261,880, filed on Dec. 2, 2015, entitled: "Patterned exfoliation of single crystal silicon wafers on to display glass for creating silicon mesas for thin film transistors to create mobile display backplanes", U.S. Provisional Patent Application Ser. No. 62/262,358, filed on Dec. 2, 2015, entitled: "STRUCTURE AND METHOD FOR HIGH PERFORMANCE LARGE-GRAIN-POLY SILICON, LGPS, BACKPLANE FOR OLED BACKPLANES", and U.S. Provisional Patent Application Ser. No. 62/262,361, filed on Dec. 2, 2015, entitle: "STRUCTURES AND METHODS FOR THIN EXFOLIATED SILICON LAYER ON GLASS WITH GOOD FIELD STITCHING" all of which are incorporated herein by reference.

BACKGROUND

Semiconductor backplanes for AMOLED displays lager than Smartphone's are today limited to amorphous silicon, its derivative Low Temperature Poly Silicon (LTPS), and so-called Oxide or IGZO. Amorphous silicon, the dependable material for Flat Panel Displays (FTD) including today's Large Screen TVs, are LCD displays. However, a-Si with its low electron mobility of about 1 $cm^2$/V-sec, is not suitable for OLED displays, which are current-driven devices, requiring low impedance semiconductors.

The industry has turned to two alternatives for AMOLED displays, laser-crystallized a-Si, generally referred as LTPS, and Oxide (IGZO). LTPS has nearly 100 times the electron mobility, and very adequate for OLED backplanes. It has been overwhelmingly adopted for AMOLED Smartphones, but its high defectivity rate has limited its use to this application, and the LTPS panel sizes for small displays like I-PODS, is slowly emerging.

Increasingly IGZO, with an electron mobility of about 30 cm2/V-sec, is another choice for OLED in larger display formats, including televisions, mainly because the ability to form large monolithic coatings of great uniformity. For this reason, it is often said IGZO is akin to a-Si, in its ease and cost of fabrication. In fact several companies have developed large IGZO-based Televisions. But uniformity in coating thickness does not translate into uniformity, and stability, on threshold voltages and other critical parameters. Lately (in 2015) a large display manufacturer has encountered serious financial problems betting on IGZO.

SUMMARY OF THE DESCRIPTION

In some embodiments, the present invention discloses substrates, and methods to form the substrates, that include large grain polysilicon on a handle substrate such as a glass or a glass-ceramic substrate. The methods can include transferring a layer of silicon, e.g., large grain polysilicon or epitaxial grown silicon on a large grain polysilicon substrate, on the handle substrate.

In some embodiments, the present invention discloses a selective exfoliation process for transferring silicon films from a silicon substrate to a handle substrate. The selective exfoliation process can allow a complete utilization of a silicon substrate.

In some embodiments, the present invention discloses a conformal loading process for stitching portions of silicon films on a large handle substrate. The conformal loading can allow the formation of nearby silicon portions that are coupled edges to edges.

BRIEF DESCRIPTION OF THE DRAWINGS

FIGS. 1A-1C illustrate a process for forming silicon on glass according to some embodiments.
FIGS. 4A-4C illustrate flow charts for forming polysilicon on glass substrates according to some embodiments.
FIGS. 18A-18B illustrate flow charts for selective exfoliation according to some embodiments.
FIGS. 21A-21B illustrate flow charts for selective transfer according to some embodiments.
FIGS. 23A-23C illustrate flow charts for forming silicon on glass according to some embodiments.

DETAILED DESCRIPTION OF THE EMBODIMENTS

Figure 2A:
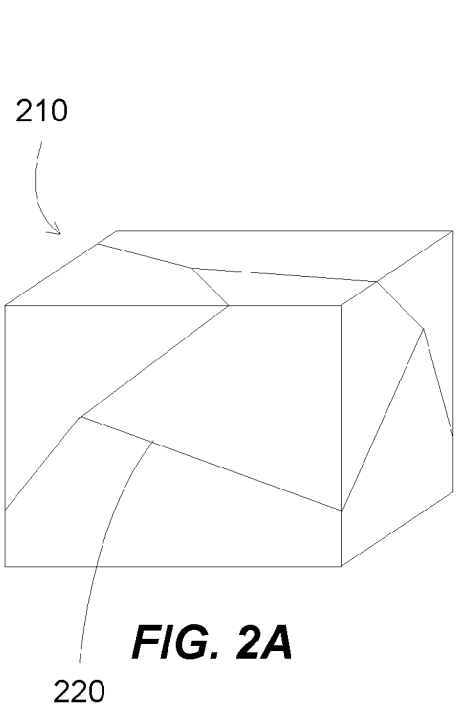
FIGS. 2A-2C illustrate a process for forming a polysilicon on glass substrate according to some embodiments.

In some embodiments, the present invention discloses methods, and substrates resulted from the methods, to form a silicon layer on a substrate. The silicon layer can include large grain polysilicon. The methods can include transferring a layer of silicon, e.g., large grain polysilicon or epitaxial grown silicon on a large grain polysilicon substrate, on a substrate, such as a glass or glass-ceramic substrate.

In some embodiments, a large grain polysilicon substrate can be provided, for example, by slicing large grain polysilicon blocks. The large grain polysilicon blocks can be formed by melting silicon, and the slowly re-crystallizing the melted silicon. The large grain polysilicon can be called multicrystalline silicon. The average grain size of large grain polysilicon can be in order of $mm^2$ or $cm^2$, e.g., having a linear dimension of 1-20 mm. Thus the large grain polysilicon can have an average grain size of 1-100 microns, 0.1-1 mm, or 1-10 mm.

A defect plane can be formed under the polysilicon substrate. For example, ion implantation can be used to form the defect plane under the polysilicon substrate. Alternatively, a porous etching process can be performed on the surface of the polysilicon, and then an epitaxial layer can be deposited on the porous plane. After bonding the defect polysilicon substrate to a handle substrate, such as a glass or glass-ceramic substrate, the bonded substrates can be subjected to a stress process, such as heating and cooling, to break the defect plane, forming a layer of silicon bonded to the handle substrate.

FIGS. 1A-1C illustrate a process for forming silicon on glass according to some embodiments. FIG. 1A shows a single crystal silicon ingot 110. FIG. 1B shows a single crystal silicon substrate 115, which was sliced from the ingot 110. The round silicon substrate 115 can be cut to form 1 rectangular silicon substrate 130. Multiple layers of silicon from the rectangular substrates 130 can be exfoliated on a glass substrate 950, forming high performance backplanes, e.g., a single crystal silicon type of backplanes. Since the rectangular substrates 130 are limited by the size of the ingot 110, multiple layers can be stitched together in the glass substrate 950, leaving a gap 940 between the silicon portions 930.

For example, the single crystal silicon substrate is first implanted with hydrogen to a depth of about 50-500 nm, and afterwards bonded at room temperature, to a clean glass surface, to first form a tenuous hydrogen bond, which is strengthened by heating to about 600° C., to form a permanent strong bond, whereupon a single crystal silicon layer is exfoliated on to the glass substrate. This silicon-on-glass (SiOG) substrate can be used to form high performance displays. The single crystal silicon source substrate can be used for forming the SiOG layer many times over.

The readily-available single-crystal silicon wafers size is limited to 300 mm. In this invention, we propose to overcome the size limitations imposed by single-crystal silicon wafers, by using instead 'multi-crystalline' silicon wafers, generally made from cast silicon ingots of much larger sizes, for solar cell applications.

Once again the practical sizes for which this can be used for display applications, will be limited by the ability to slice, and polish such polycrystalline wafers. Polycrystalline silicon (e.g., polysilicon) wafers up to 10" square, are routinely used for solar cell, and will be available for this application.

Figure 2B:
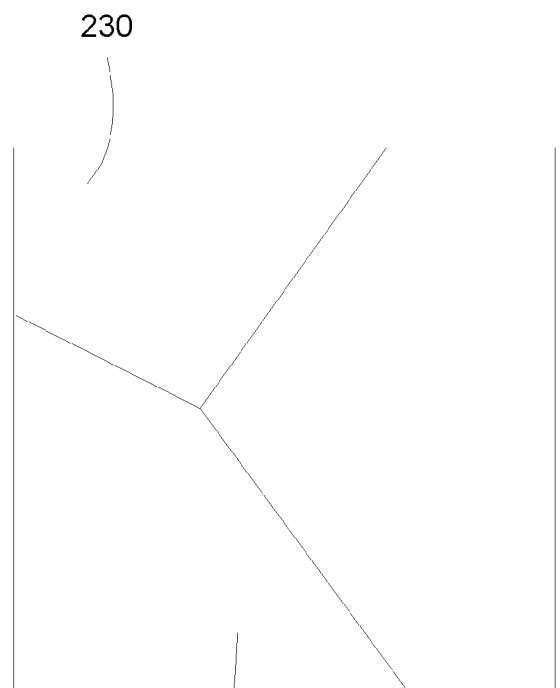
Figure 2C:
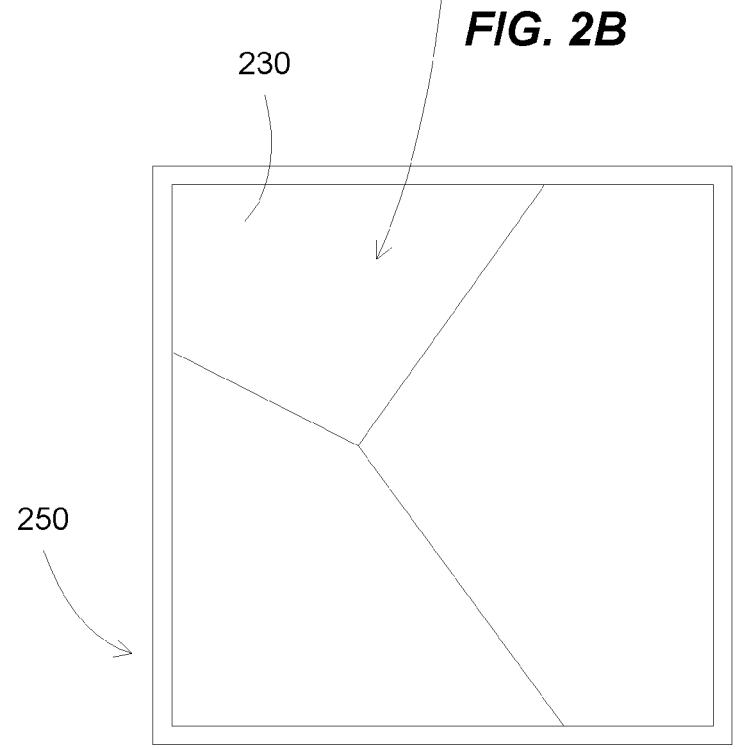

FIGS. 2A-2C illustrate a process for forming a polysilicon on glass substrate according to some embodiments. FIG. 2A shows a polysilicon block 210 with large grain boundary 220. FIG. 2B shows a polysilicon substrate 230, sliced from the polysilicon block 210. FIG. 2C shows a silicon on glass substrate 250, including a layer of polysilicon, e.g., exfoliated from the polysilicon substrate 230, on a handle substrate, such as a glass or glass ceramic substrate. A benefit of using polysilicon is that the polysilicon substrate can be selected to match the size of the handle substrate, thus there can be no seams within the silicon on glass substrate 250.

Another benefit of these large grained polycrystalline silicon backplane material is their higher expected electron mobility compared to deposited polysilicon, and can be approaching that of single crystal silicon. In the case of low temperature polycrystalline silicon (LTPS), where the grains range from 100 to 500 nm, it has been shown that electron mobility increases with grain size. The grain sizes in solar poly silicon wafers can be in the millimeter level.

For this reason, we name this Large-Grained—Polysilicon, LGPS, to distinguish it from the LTPS.

It is known that H-ion implant exfoliation, in single crystal silicon, is largely insensitive to crystal orientation. Any minor variations in the topography of exfoliated polycrystalline SiOG layer can be dealt with a light chemical mechanical polishing. The same treatment also restores the source wafer for many more implant/exfoliations.

The silicon cost per backplane is small, the major cost for this Cost-of Ownership, COO, for implant process. We estimate this to be about $10/sq.ft. including labor. The SiOG process yields will also be higher than that for LTPS because of lower defectivity, simpler TFT structure.

Figure 3A:
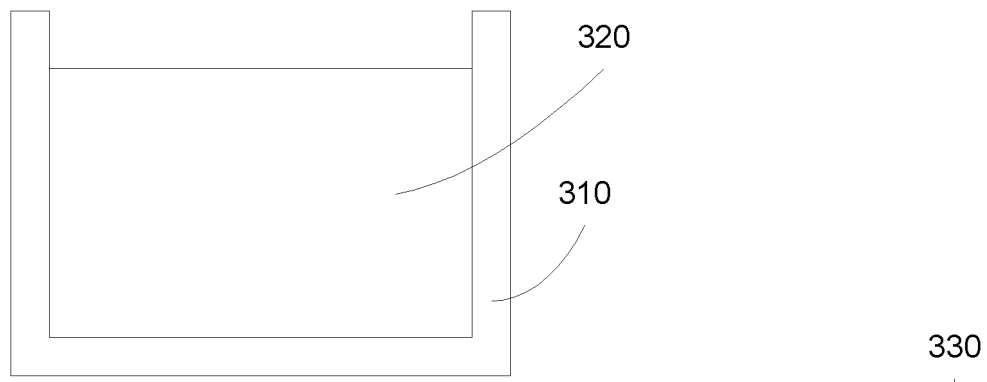
FIGS. 3A-3C illustrate a process for forming large grain polysilicon substrates according to some embodiments.
Figure 3B:
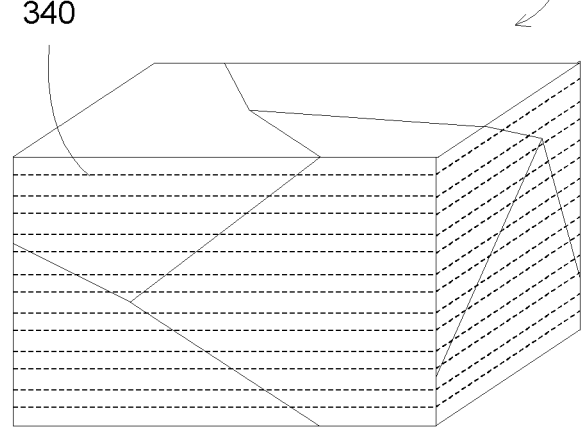
Figure 3C:
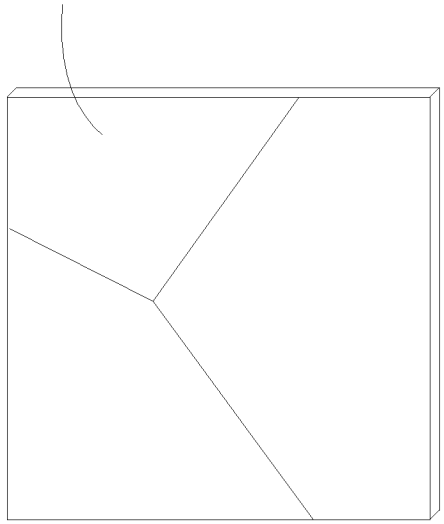

FIGS. 3A-3C illustrate a process for forming large grain polysilicon substrates according to some embodiments. In FIG. 3A, silicon 320 is melted and then gradually cooled down to form a solid block of polysilicon 330. The cooling process can be controlled, for example, by gradually cooling from the bottom of the melted silicon container 310 to the top portion, to achieve large grain silicon blocks. In FIG. 3B, the polysilicon block 330 is sliced 340 into thin substrates 350. In FIG. 3C, the sliced polysilicon substrate 350 can be polished.

FIGS. 4A-4C illustrate flow charts for forming polysilicon on glass substrates according to some embodiments. In FIG. 4A, operation 400 exfoliates a thin film of polysilicon on a substrate such as a glass or glass-ceramic substrate. In FIG. 4B, operation 420 provides a polysilicon substrate. Operation 430 selects a substrate, such as a glass or glass-ceramic substrate, wherein the glass or glass-ceramic substrate has a similar dimension as the polysilicon substrate. Operation 440 exfoliates a layer from the polysilicon substrate onto the glass or glass-ceramic substrate.

In FIG. 4C, operation 460 forms a defect plane under a polysilicon substrate. Operation 470 transfers a layer of the polysilicon substrate formed by the defect plane onto a glass or glass-ceramic substrate.

In some embodiments, the present invention discloses methods, and substrates resulted from the methods, to form a large grain polysilicon layer on a handle substrate such as a glass or glass-ceramic substrate, e.g., forming a LGPS substrate. The LGPS substrate can include a layer of large grain polysilicon on a handle substrate, to be used in forming silicon devices on the handle substrate, such as backplanes for displays or sensor planes for x-ray detection.

In some embodiments, a LGPS substrate can be formed with the polysilicon layer extracted, e.g., exfoliated, from a thicker polysilicon substrate. For example, by annealing a composite substrate including a polysilicon substrate bonded to a glass or glass ceramic substrate, the polysilicon can exfoliated, e.g., cracking along a crystal plane. Thus a thin polysilicon layer can be extracted from the polysilicon substrate and still attached to the handle substrate.

In some embodiments, a defect plane or layer can be formed at a desired thickness of the polysilicon substrate before an exfoliation process, wherein the defect plane can act as nucleation sites for the exfoliation, causing a silicon layer to be released from the silicon substrate at the defect plane. The defect plane can be generated by ion implantation to form a plane of impurity at a region beneath the surface of the polysilicon substrate. Since hydrogen implant exfoliation is largely insensitive to crystal orientation, a polysilicon layer can be exfoliated from a polysilicon substrate after being implanted. Alternatively, the defect plane can be generated by wet etching, forming a plane of void bubbles at a region underneath the substrate surface. Also, a partial defect layer can be generated on the surface of the silicon substrate, and a layer of silicon, preferably epitaxial silicon, can be deposited on the surface of the silicon substrate, using the undefect area as seed sites, to bury the defect plane underneath the surface.

FIGS. 5A-5D illustrate a process to form a silicon layer on a glass or glass-ceramic substrate using an exfoliate process according to some embodiments.

Figure 5A:
FIGS. 5A-5D illustrate a process to form a silicon layer on a glass or glass-ceramic substrate using an exfoliate process according to some embodiments.
Figure 5B:
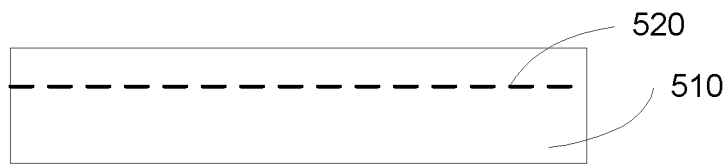
Figure 5C:
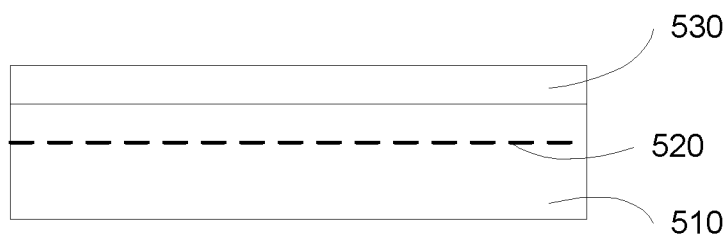
Figure 5D:
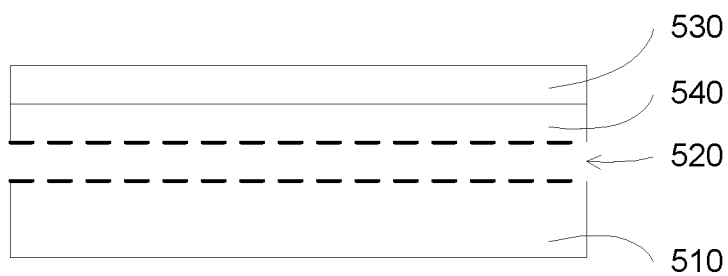

In FIG. 5A, a polysilicon substrate 510 is provided. An impurity implantation process, such as hydrogen, helium or oxygen implantation, is performed on the surface of the polysilicon wafer 510, creating an impurity region 520 underneath the polysilicon surface (FIG. 5B). The polysilicon substrate 510 with the implantation layer 520 is then bonded to a handle substrate 530, such as a glass or glass-ceramic substrate. The composite substrate of polysilicon and glass/glass-ceramic can be heated, for example, above 400 C. The composite substrate can be cooled to room temperature, and the thermal expansion mismatch can exfoliate the polysilicon substrate at the defect plane of impurity implantation 520, creating a thin polysilicon layer 540 on the glass or glass-ceramic substrate 530, together with a remaining polysilicon substrate (FIG. 5D). In some embodiments, a rapid cooling process can be used, for example, to accelerate the exfoliation process.

Figure 6:
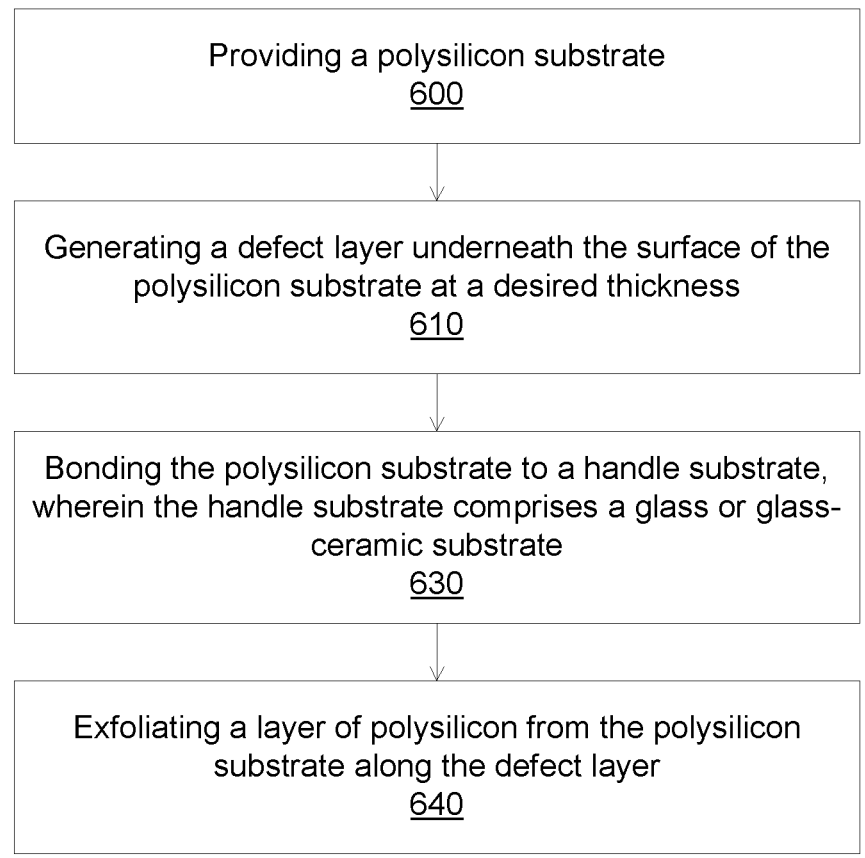
FIG. 6 illustrates a flowchart to form a LGPS substrate according to some embodiments.

FIG. 6 illustrates a flowchart to form a LGPS substrate according to some embodiments. Operation 600 provides a polysilicon substrate. Operation 610 generates a defect layer underneath the polysilicon substrate surface at a desired depth, for example, by ion implantation. Operation 620 bonds the polysilicon substrate with a handle substrate, such as a glass or glass-ceramic substrate. Operation 640 exfoliates a layer of polysilicon from the polysilicon substrate along the defect layer to form a composite substrate of polysilicon on glass.

In some embodiments, the LGPS substrate can include a glass layer or a glass-ceramic layer coupled to the polysilicon layer. A support substrate can be included.

In some embodiments, the present invention discloses forming a substrate having a layer of polycrystalline silicon. The polycrystallinesilicon layer can be used to fabricate silicon devices. A substrate, such as a ceramic substrate, including a transparent glass or quartz substrate, can be coupled to a polycrystallinesilicon wafer having a defect plane. A heating process, with a surface force, can be used to expand the defect plane along the plane direction, and can exfoliate a layer of the polycrystallinesilicon wafer on the substrate.

Figure 7A:
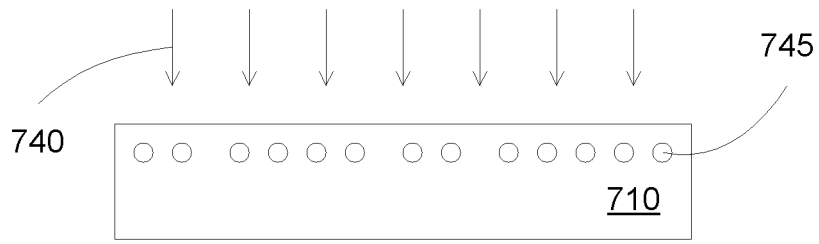
FIGS. 7A-7H illustrate a process for forming a LGPS substrate according to some embodiments.

FIGS. 7A-7H illustrate a process for forming a LGPS substrate according to some embodiments. In FIG. 7A, a substrate 710 can be provided. The substrate can be a polycrystalline silicon substrate. The substrate 710 can be implanted 740 with an implantation species such as hydrogen, helium, or oxygen. The energy of the implantation species can be configured to form a layer of defects 745 in the substrate 710.

Figure 7B:
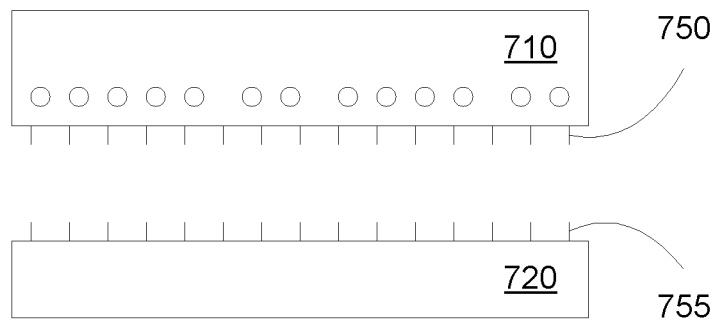

In FIG. 7B, the substrate 710 can be prepared for a bonding process with a substrate 720, which can be a glass or a glass-ceramic layer or a transparent layer. For example, the substrates 710 and 720 can be cleaned in a wet cleaning process. The substrates can have a thin oxide grown on the surface, for example, by a plasma oxidation or a furnace oxidation process. After a cleaning process, the two substrates can have a clean surface, such as a hydrogen or OH terminated surface 750, 755. The clean surface 750 and 755 can facilitate the bonding between the substrates 710 and 720.

In some embodiments, the substrate 720 can be a glass plate having thickness between 0.5 and 3 mm. The glass can include Corning LCD glass, CODE 1737 F, and Corning Willow Glass. Other commercial glass makers, Asahi and Schott can be used. These glasses can have the desired properties of appropriate CTE, and T-strain, and can have the advantages of low costs, easy availability and highly reproducible properties, together with being manufactured in large volumes.

Figure 7C:
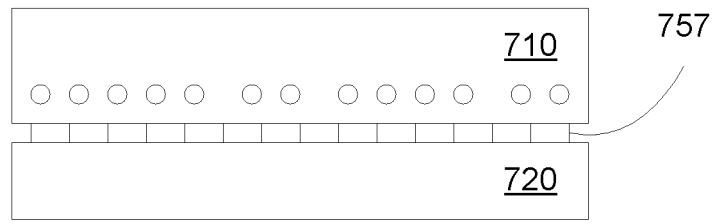

In FIG. 7C, after cleaning, the substrates can be brought together for a contact bonding. The substrates can be flat and clean, and when brought together in intimate contact, can form contact bonding 757. Hydrogen or OH terminated surfaces can be used to explain the bonds between the two substrates. However, the substrate surfaces can have different microscopic behaviors. In some embodiments, the substrate 710 can be a silicon substrate, which can be very flat and free of defects, after a cleaning process, such as an HF cleaning, SC1 clean ($H_2O_2+NH_4OH$) for organic contamination removal, and/or SC2 clean ($H_2O_2+H_2SO_4$) for ionic and metal contamination removal. The substrate 720 can also be flat and free of defects. The substrate 720 can include a glass substrate, a glass-ceramic substrate, or any other substrates or composite substrates which are flat and cleaned.

The surface bonding 757 between substrates 710 and 720 can be strong, e.g., bonding the two substrates together. The surface bonding can be peeled off, e.g., lifting from one end and slowly separating the two substrates. However, the bond can be strong so that a high shear force or a high tension force could be needed to separate the substrates.

Figure 7D:
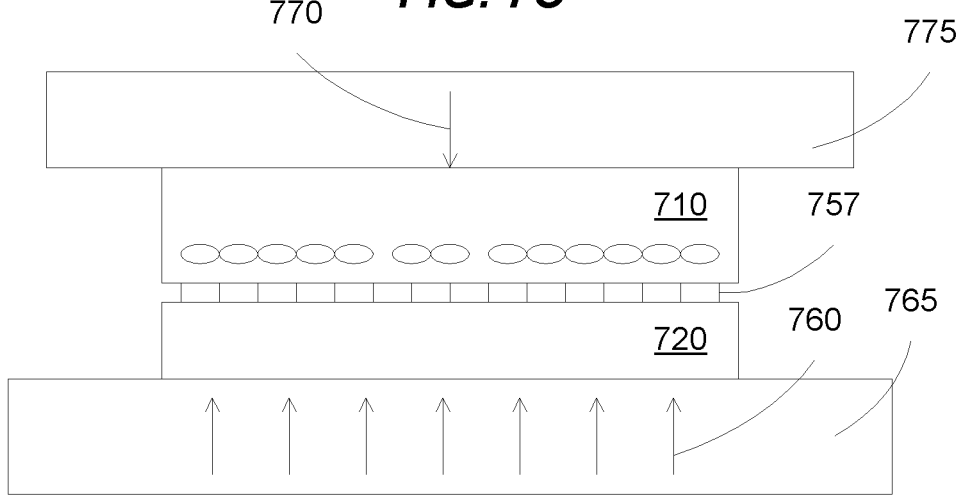

In FIG. 7D, the two substrates 710 and 720 can be subjected to a low temperature heating 760, e.g., less than about 600 C., such as between 400 and 500 C. The thermal energy from the heating process can coalesce the implantation species, forming a continuous defect layer that can separate the top portion of the substrate 710 from the body portion. The implantation species can migrate laterally to form a defect plane if prohibited from moving vertically to the surface. Thus the bond between the two substrate surfaces can be configured to provide an intimate contact, to prevent the implantation species from escape. Further, the substrate 720 can form a solid surface, which can also prevent the implantation species from penetrating the substrate 720.

In some embodiments, a force 770 can be applied to the two substrates, e.g., either to the substrate 710 or to the substrate 720, to push the two substrates together. The force can prevent the implantation species from moving vertically to the surface of the substrate 710, for example, by pushing the two substrates apart, breaking the bond 757 between the two substrate surfaces. The force can be applied during the heating process, e.g., assisting in the lateral growth of the impurity species for the exfoliation.

The force can be distributed on the surfaces of the two substrates, such as substantially uniform distributed over the substrate surfaces. The distributed force can ensure that the substrate 710 is in intimate contact with the substrate 720, thus forcing the impurities 745 to coalesce in a lateral direction, and preventing the impurities 745 from escaping the substrate 710.

In some embodiments, the force can be generated by a weight placing on the composite substrates, e.g., on either the substrate 710 or on the substrate 720. For example, the substrates 710 and 720 can be placed on a heating plate 765. A weight 775 can be placed on the substrates 710 and 720. Thermal energy 760 can be supplied to the substrates, enlarging the impurities 745. Force 770, caused by the weight 775, can be distributed on the substrates to limit the escape of the impurities, thus forcing the impurities to coalesce laterally, e.g., in the direction of the lateral surface of the substrates. Other configuration can be used, such as a clamp, clamping the two substrates together.

In some embodiments, the temperature heating 760 can be gradually increased, for example, from room temperature or higher (such as 200 C.) to 500 or 600 C., or until the substrate 710 is exfoliated. For example, during the increase in temperature, the impurities can coalesce, and when the impurities can fill the lateral surface, a layer 715 can be exfoliated from the substrate 710. When exfoliated, an exfoliated force can be formed, pushing the two substrates apart.

In some embodiments, the force 770 can be configured to be about the same or less than the exfoliated force. This can create an end point detection for the exfoliation process, e.g., when the layer 715 is exfoliated from the substrate 710, the remaining portion of the substrate 710 can be pushed against the weight 775 such as the weight 775 can be visibly moved.

In some embodiments, the temperature heating 760 can be stepwise increased, for example, from room temperature to about 200 C., stopping for a few seconds to a few minutes, and then increased to 300 C and stopping again for a few seconds to a few minutes. The step increase can be about 5 C., 10 C., 20 C., or 50 C., instead of 100 C. For example, the temperature can increase from 200 C. to 205 C., stopping for a few seconds, then increase to 210 C., and then stopping for a few more seconds. The process can continue until reaching the temperature of exfoliation, or until the layer 715 is exfoliated from the substrate 710.

Figure 7E:
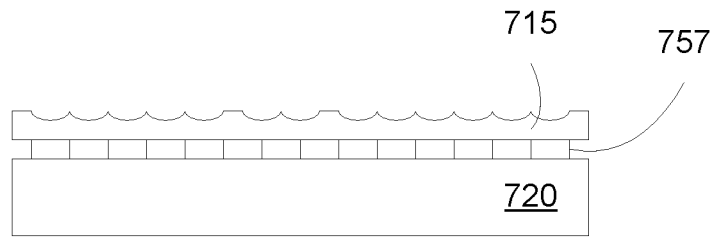
Figure 7F:
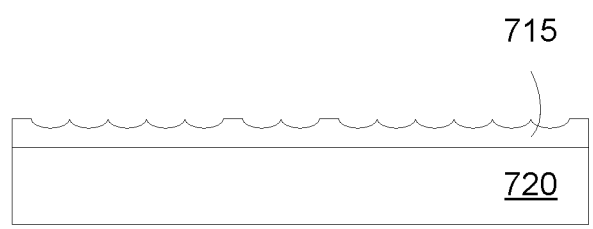

In FIG. 7E, the top surface layer 715 of the substrate 710 can be exfoliated, for example, at the defect plane formed by the implantation species. In FIG. 7F, an optional high temperature anneal (for example, at between 400 C. to 800 C.) can be performed, solidly bonding the top surface layer 715 to the substrate 720.

In some embodiments, the resulting composite substrate can include the polycrystalline silicon layer 715 bonded with a glass or glass ceramic substrate 720.

Figure 7G:
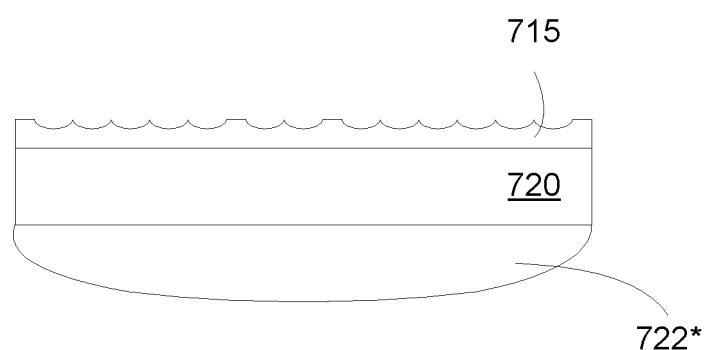
Figure 7H:
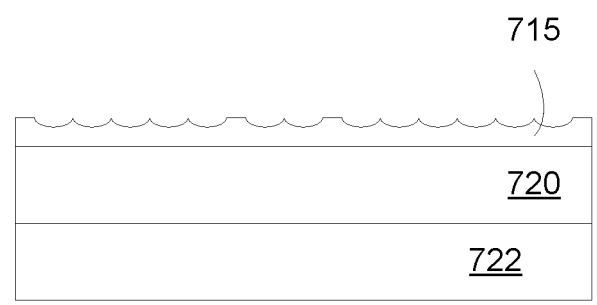

In some embodiments, an optional ceramic layer can be applied to the resulting composite substrate. In FIG. 7G, a layer of a ceramic paste 722\* can be applied to the substrate 720. The total substrates can be sintered, e.g., annealing at a high temperature such as between 800 C. and 1200 C., to form a composite substrate, including a polycrystalline silicon layer 715 on a glass or glass-ceramic substrate 720 on a ceramic layer 722 (FIG. 7H).

Figure 8:
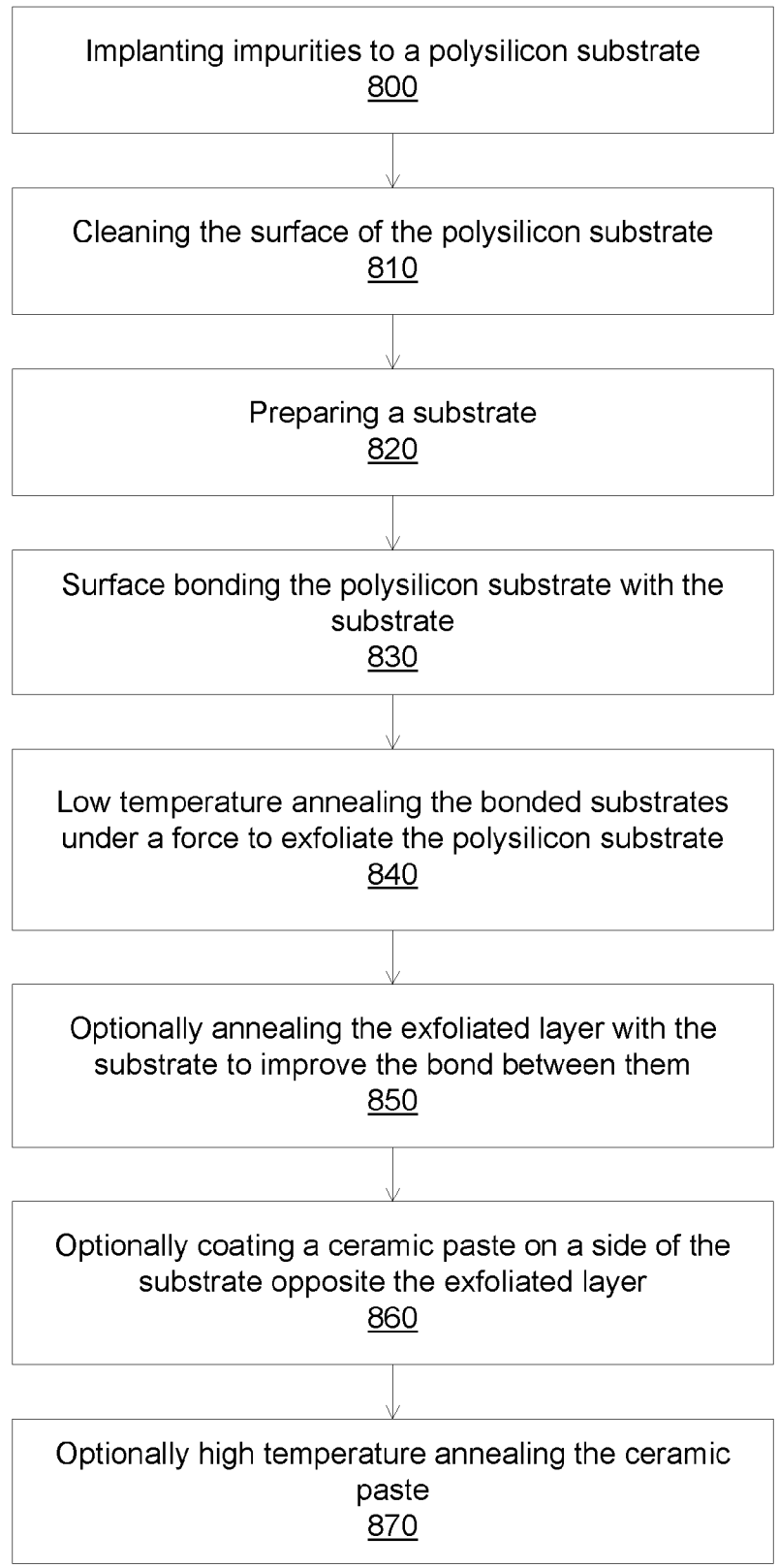
FIG. 8 illustrates a flowchart for fabricating a composite substrate according to some embodiments.

FIG. 8 illustrates a flowchart for fabricating a composite substrate according to some embodiments. A polysilicon substrate can be prepared. Other substrates can be used, such as a polygermanium substrate. Operation 800 implants impurities to the polysilicon substrate. The impurities can include hydrogen and helium. The dose of the impurities can be medium, e.g., enough to provide a defect plane of impurity without separating the surface layer. The energy of the impurities can be elected to provide a defect plane at a depth below the surface of more than 0.3, 0.5, 1, 5, 10, or 20 microns. The substrate can be a bare substrate, e.g., a polysilicon substrate having a bare polysilicon surface. The substrate can have an oxide layer on the surface, such as less than 0.1 micron, or less than 10 nm.

Operation 810 cleans the surface of the polysilicon substrate. The cleaning can be performed in a dilute HF solution, a SC1 cleaning and/or a SC2 cleaning. In some embodiments, the cleaning process can form a surface with hydrogen or OH terminated bonds.

Operation 820 prepares a substrate, which can be glass or a glass-ceramic layer. The substrate can be a transparent substrate, a glass substrate, a ceramic substrate such as aluminum oxide, or a composite substrate of multiple layers. The substrate can be cleaned, for example, with HF, SC1 and/or SC2. The substrate can also include oxygen elements, which can exhibit an oxide terminated surface. Also, a cleaning process can prepare the substrate to have a hydrogen or OH terminated surface.

In some embodiments, operation 820 prepares a transparent glass or glass ceramic substrate.

Operation 830 bonds the polysilicon substrate surface with the substrate surface. After cleaning the surfaces of the substrates, the two substrates can be brought together, and the close proximity between the two substrates can form a surface bonding. Hydrogen or OH terminated surfaces can be responsible to the surface bonding between the two substrates.

Operation 840 heats the bonded substrates at a low temperature to exfoliate the polysilicon substrate. The thermal energy can coalesce the implanted impurities, forming a defect plane that can separate, e.g., exfoliate, the top portion of the surface. The heating process can occur with the bonded substrates under a force, for example, to minimizing the escape of the impurity species.

Operation 850 optionally anneals the exfoliated substrate together with the substrate at a high temperature to strengthen the surface bond between the exfoliated substrate and the substrate.

Operation 860 optionally coats a layer of ceramic paste to a backside of the substrate. Operation 870 optionally anneals the bonded substrates at a high temperature to strengthen the surface bond between the three substrates.

Figure 9A:
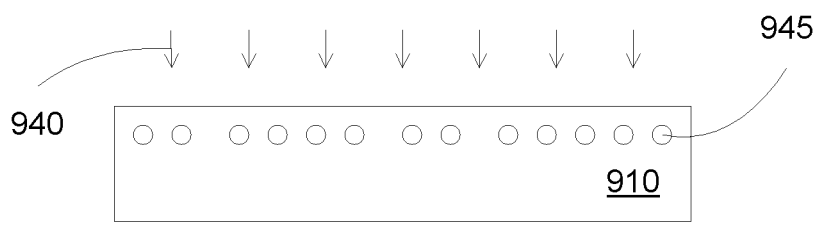
FIGS. 9A-9E illustrate a process for forming a LGPS substrate according to some embodiments.

FIGS. 9A-9E illustrate a process for forming a LGPS substrate according to some embodiments. In FIG. 9A, a substrate 910 can be provided. The substrate can be a polycrystalline silicon substrate. The substrate 910 can be implanted 940 with an implantation species such as hydrogen, helium, or oxygen. The energy of the implantation species can be configured to form a layer of defects 945 in the substrate 910.

Figure 9B:
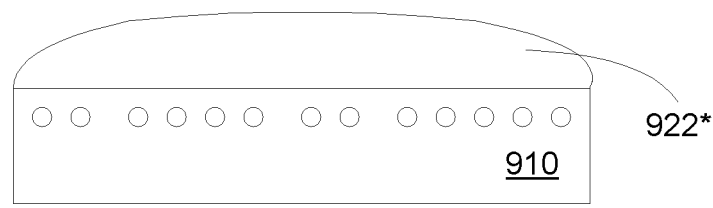
Figure 9C:
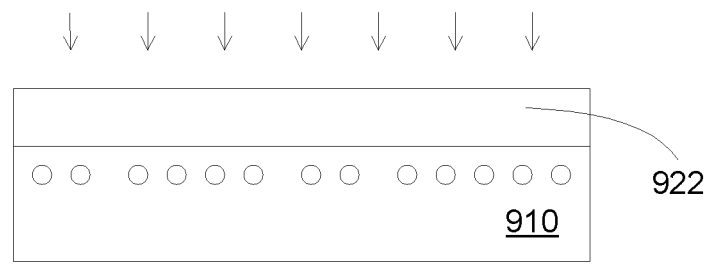

In FIG. 9B, a layer of a ceramic paste 922\* can be applied to the substrate 910, e.g., on the implanted surface of the substrate 910. In FIG. 9C, the layer of a ceramic paste 922\* can be dried to form a dried ceramic paste layer 922, for example, by a low heating process at a temperature between 50 and 200 C., or can be dried in air.

In FIG. 9C, the two substrates 910 and 922 can be subjected to a low temperature heating 960, e.g., less than about 600 C., such as between 400 and 500 C. The thermal energy from the heating process can coalesce the implantation species, forming a continuous defect layer that can separate the top portion of the substrate 910 from the body portion. The implantation species can migrate laterally to form a defect plane if prohibited from moving vertically to the surface. Thus the bond between the two substrate surfaces can be configured to provide an intimate contact, to prevent the implantation species from escape. Further, the substrate 922 can form a solid surface, which can also prevent the implantation species from penetrating the substrate 920.

In some embodiments, a force 970 can be applied to the two substrates, e.g., either to the substrate 910 or to the substrate 922, to push the two substrates together. The force can prevent the implantation species from moving vertically to the surface of the substrate 910, for example, by pushing the two substrates apart, breaking the bond between the two substrate surfaces. The force can be applied during the heating process, e.g., assisting in the lateral growth of the impurity species for the exfoliation.

The force can be distributed on the surfaces of the two substrates, such as substantially uniform distributed over the substrate surfaces. The distributed force can ensure that the substrate 910 is in intimate contact with the substrate 922, thus forcing the impurities 945 to coalesce in a lateral direction, and preventing the impurities 945 from escaping the substrate 910.

In some embodiments, the force can be generated by a weight placing on the composite substrates, e.g., on either the substrate 910 or on the substrate 922. For example, the substrates 910 and 922 can be placed on a heating plate 965. A weight 975 can be placed on the substrates 910 and 922. Thermal energy 960 can be supplied to the substrates, enlarging the impurities 945. Force 970, caused by the weight 975, can be distributed on the substrates to limit the escape of the impurities, thus forcing the impurities to coalesce laterally, e.g., in the direction of the lateral surface of the substrates. Other configuration can be used, such as a clamp, clamping the two substrates together (FIG. 27D).

In some embodiments, the temperature heating 960 can be gradually increased, for example, from room temperature or higher (such as 200 C.) to 500 or 600 C., or until the substrate 910 is exfoliated. For example, during the increase in temperature, the impurities can coalesce, and when the impurities can fill the lateral surface, a layer 915 can be exfoliated from the substrate 910. When exfoliated, an exfoliated force can be formed, pushing the two substrates apart.

In some embodiments, the force 970 can be configured to be about the same or less than the exfoliated force. This can create an end point detection for the exfoliation process, e.g., when the layer 915 is exfoliated from the substrate 910, the remaining portion of the substrate 910 can be pushed against the weight 975 such as the weight 975 can be visibly moved.

In some embodiments, the temperature heating 960 can be stepwise increased, for example, from room temperature to about 200 C., stopping for a few seconds to a few minutes, and then increased to 300 C. and stopping again for a few seconds to a few minutes. The step increase can be about 5 C., 10 C., 20 C., or 50 C., instead of 100 C. For example, the temperature can increase from 200 C. to 205 C., stopping for a few seconds, then increase to 210 C., and then stopping for a few more seconds. The process can continue until reaching the temperature of exfoliation, or until the layer 915 is exfoliated from the substrate 910.

Figure 9D:
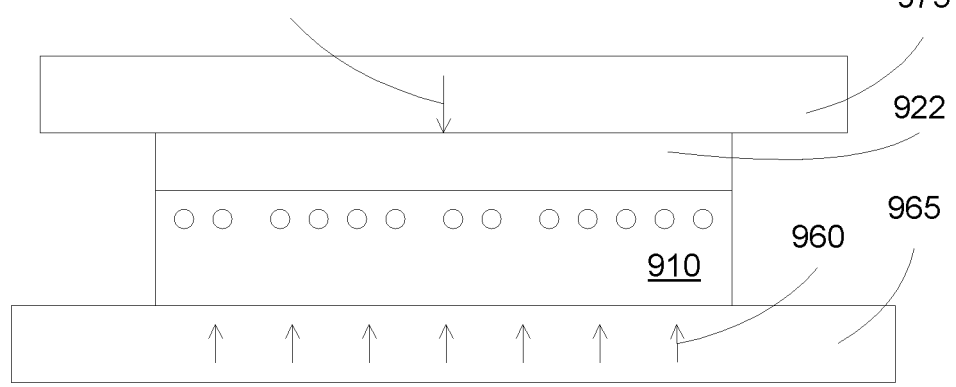
Figure 9E:
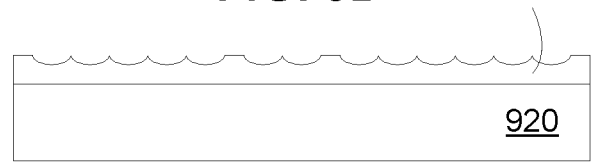

In FIG. 9D, the top surface layer 915 of the substrate 910 can be exfoliated, for example, at the defect plane formed by the implantation species. In FIG. 9E, an optional high temperature anneal (for example, at between 800 C. to 1200 C.) can be performed, to sinter the dried ceramic paste layer.

In some embodiments, the resulting composite substrate can include the polycrystalline layer 915 bonded with a ceramic substrate 920.

Figure 10:
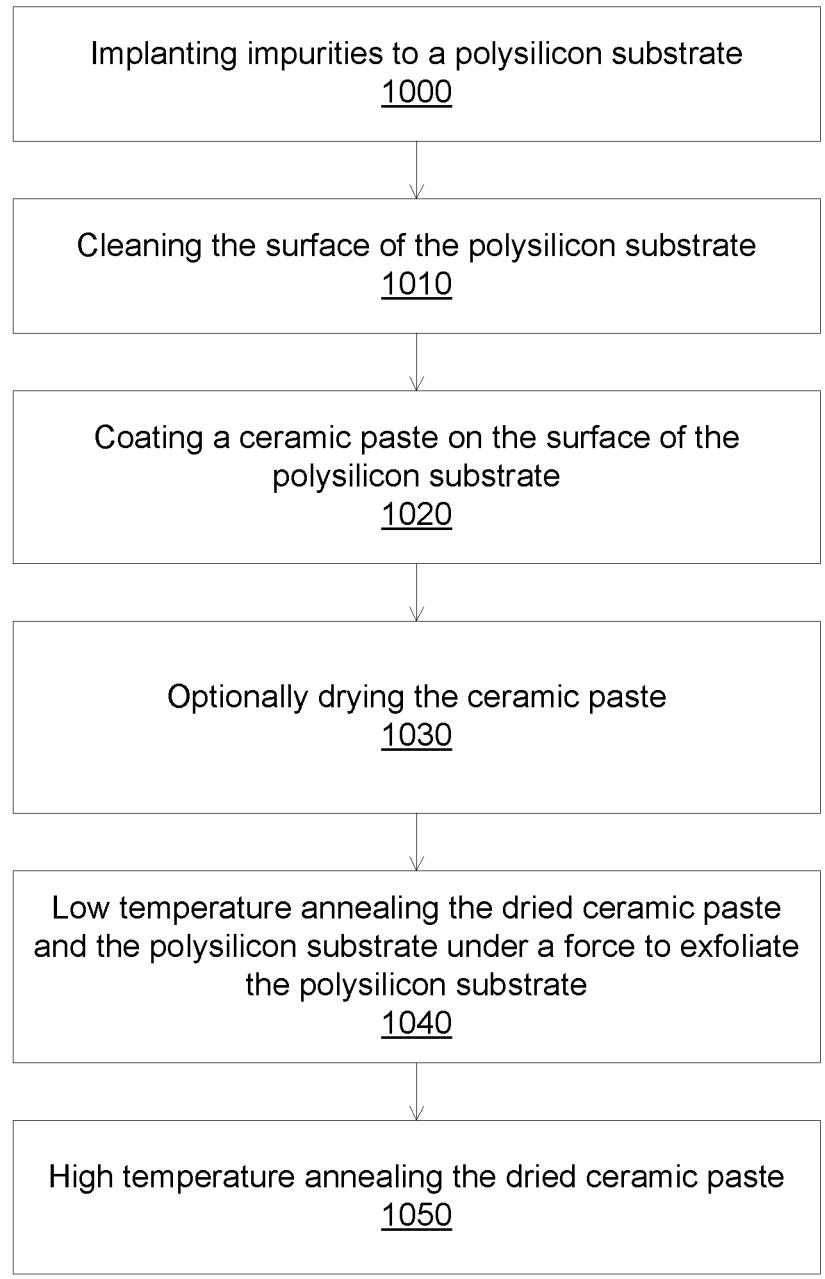
FIG. 10 illustrates a flowchart for fabricating a LGPS substrate according to some embodiments.

FIG. 10 illustrates a flowchart for fabricating a LGPS substrate according to some embodiments. A silicon-containing substrate can be prepared, such as polysilicon substrates. Other substrates can be used, such as a polygermanium substrate. Operation 1000 implants impurities to the silicon-containing substrate.

Operation 1010 cleans the surface of the silicon-containing substrate. The cleaning can be performed in a dilute HF solution, a SC1 cleaning and/or a SC2 cleaning.

Operation 1020 coats a layer of ceramic paste to a surface of the silicon-containing substrate, such as on the implanted surface. Operation 1030 optionally heats the layer of ceramic paste at a low temperature to dry the layer of ceramic paste.

Operation 1040 heats the substrates, e.g., the dried ceramic paste layer and the implanted silicon-containing substrate, at a low temperature to exfoliate the silicon-containing substrate. The thermal energy can coalesce the implanted impurities, forming a defect plane that can separate, e.g., exfoliate, the top portion of the surface. The heating process can occur with the bonded substrates under a force, for example, to minimizing the escape of the impurity species.

Operation 1050 optionally anneals the exfoliated substrate together with the dried ceramic paste layer, for example, at between 800 C. to 1200 C., to sinter the dried ceramic paste layer.

Figure 11A:
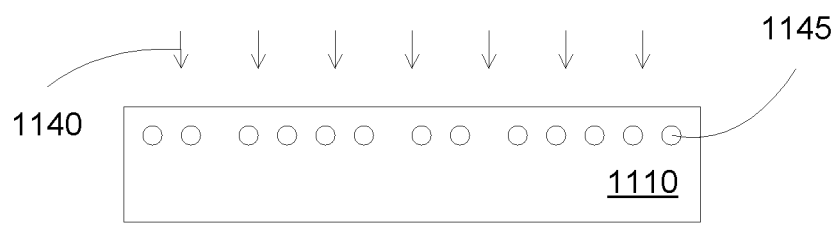
FIGS. 11A-11D illustrate a process for forming a composite substrate according to some embodiments.

FIGS. 11A-11D illustrate a process for forming a composite substrate according to some embodiments. In FIG. 11A, a substrate 1110 can be provided. The substrate can be a polycrystalline silicon substrate.

The substrate 1110 can be implanted 1140 with an implantation species such as hydrogen, helium, or oxygen. The energy of the implantation species can be configured to form a layer of defects 1145 in the substrate 1110.

Figure 11B:
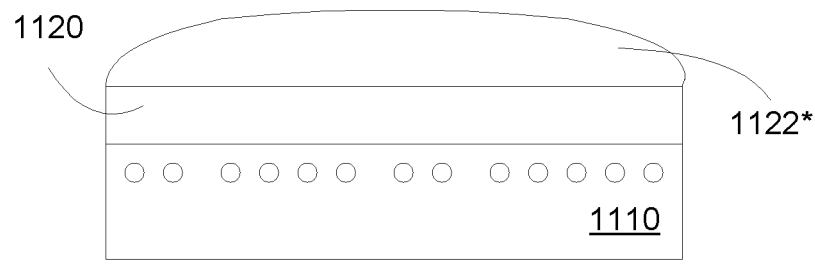

In FIG. 11B, the substrate 1110 can be prepared for a bonding process with a substrate 1120, which can be a glass or a glass-ceramic layer or a transparent layer. For example, the substrates 1110 and 1120 can be cleaned in a wet cleaning process. The substrates can have a thin oxide grown on the surface, for example, by a plasma oxidation or a furnace oxidation process. After a cleaning process, the two substrates can have a clean surface, such as a hydrogen or OH terminated surface 1150, 1155. The clean surface 1150 and 1155 can facilitate the bonding between the substrates 1110 and 1120.

After cleaning, the substrates can be brought together for a contact bonding. The substrates can be flat and clean, and when brought together in intimate contact, can form contact bonding 1157. Hydrogen or OH terminated surfaces can be used to explain the bonds between the two substrates. However, the substrate surfaces can have different microscopic behaviors.

A layer of a ceramic paste 1122* can be applied to the substrate 1110, e.g., on the implanted surface of the substrate 1110. The layer of a ceramic paste 1122* can be optionally dried to form a dried ceramic paste layer 1122, for example, by a low heating process at a temperature between 50 and 200 C., or can be dried in air.

Figure 11C:
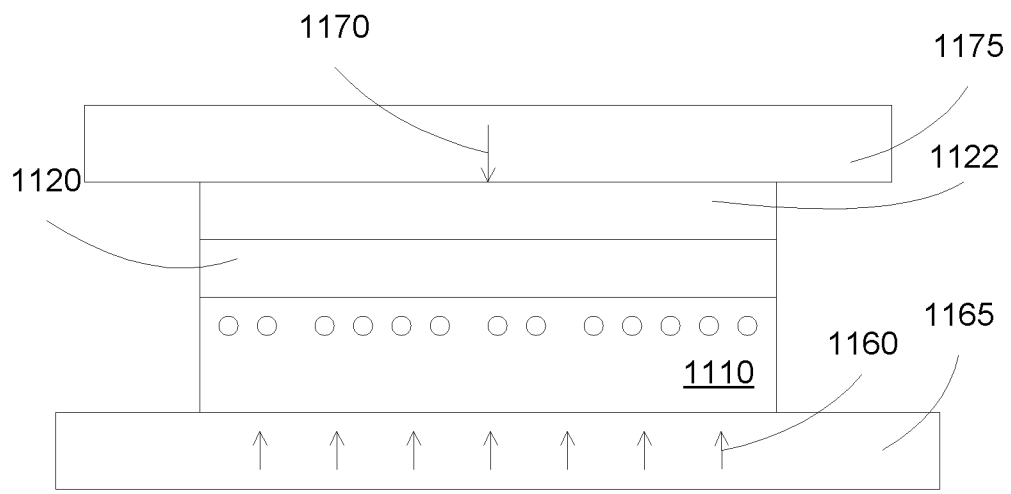

In FIG. 11C, the substrates 1110, 1120, and 1122 can be subjected to a low temperature heating 1160, e.g., less than about 600 C., such as between 400 and 500 C. The thermal energy from the heating process can coalesce the implantation species, forming a continuous defect layer that can separate the top portion of the substrate 1110 from the body portion. The implantation species can migrate laterally to form a defect plane if prohibited from moving vertically to the surface. Thus the bond between the substrate surfaces can be configured to provide an intimate contact, to prevent the implantation species from escape. Further, the substrate 1120 can form a solid surface, which can also prevent the implantation species from penetrating the substrate 1120.

In some embodiments, a force 1170 can be applied to the substrates, e.g., to the substrate 1110 or to the substrate 1122, to push the substrates together. The force can prevent the implantation species from moving vertically to the surface of the substrate 1110, for example, by pushing the substrates apart, breaking the bond between the substrate 1110 and 1120. The force can be applied during the heating process, e.g., assisting in the lateral growth of the impurity species for the exfoliation.

The force can be distributed on the surfaces of the substrates, such as substantially uniform distributed over the substrate surfaces. The distributed force can ensure that the substrate 1110 is in intimate contact with the substrate 1120, thus forcing the impurities 1145 to coalesce in a lateral direction, and preventing the impurities 1145 from escaping the substrate 1110.

In some embodiments, the force can be generated by a weight placing on the composite substrates, e.g., on either the substrate 1110 or on the substrate 1122. For example, the substrates 1110, 1120, and 1122 can be placed on a heating plate 1165. A weight 1175 can be placed on the substrates. Thermal energy 1160 can be supplied to the substrates, enlarging the impurities 1145. Force 1170, caused by the weight 1175, can be distributed on the substrates to limit the escape of the impurities, thus forcing the impurities to coalesce laterally, e.g., in the direction of the lateral surface of the substrates. Other configuration can be used, such as a clamp, clamping the two substrates together.

In some embodiments, the temperature heating 1160 can be gradually increased, for example, from room temperature or higher (such as 200 C.) to 500 or 600 C., or until the substrate 1110 is exfoliated. For example, during the increase in temperature, the impurities can coalesce, and when the impurities can fill the lateral surface, a layer 1115 can be exfoliated from the substrate 1110. When exfoliated, an exfoliated force can be formed, pushing the two substrates apart.

In some embodiments, the force 1170 can be configured to be about the same or less than the exfoliated force. This can create an end point detection for the exfoliation process, e.g., when the layer 1115 is exfoliated from the substrate 1110, the remaining portion of the substrate 1110 can be pushed against the weight 1175 such as the weight 1175 can be visibly moved.

In some embodiments, the temperature heating 1160 can be stepwise increased, for example, from room temperature to about 200 C., stopping for a few seconds to a few minutes, and then increased to 300 C. and stopping again for a few seconds to a few minutes. The step increase can be about 5 C., 10 C., 20 C., or 50 C., instead of 100 C. For example, the temperature can increase from 200 C. to 205 C., stopping for a few seconds, then increase to 210 C., and then stopping for a few more seconds. The process can continue until reaching the temperature of exfoliation, or until the layer 1115 is exfoliated from the substrate 1110.

Figure 11D:
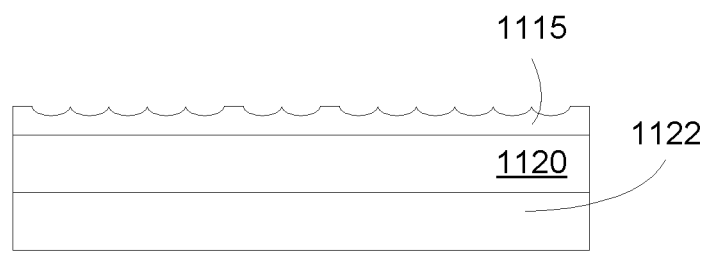

In FIG. 11D, the top surface layer 1115 of the substrate 1110 can be exfoliated, for example, at the defect plane formed by the implantation species. An optional high temperature anneal (for example, at between 800 C. to 1200 C.) can be performed, to sinter the ceramic layer.

Figure 12:
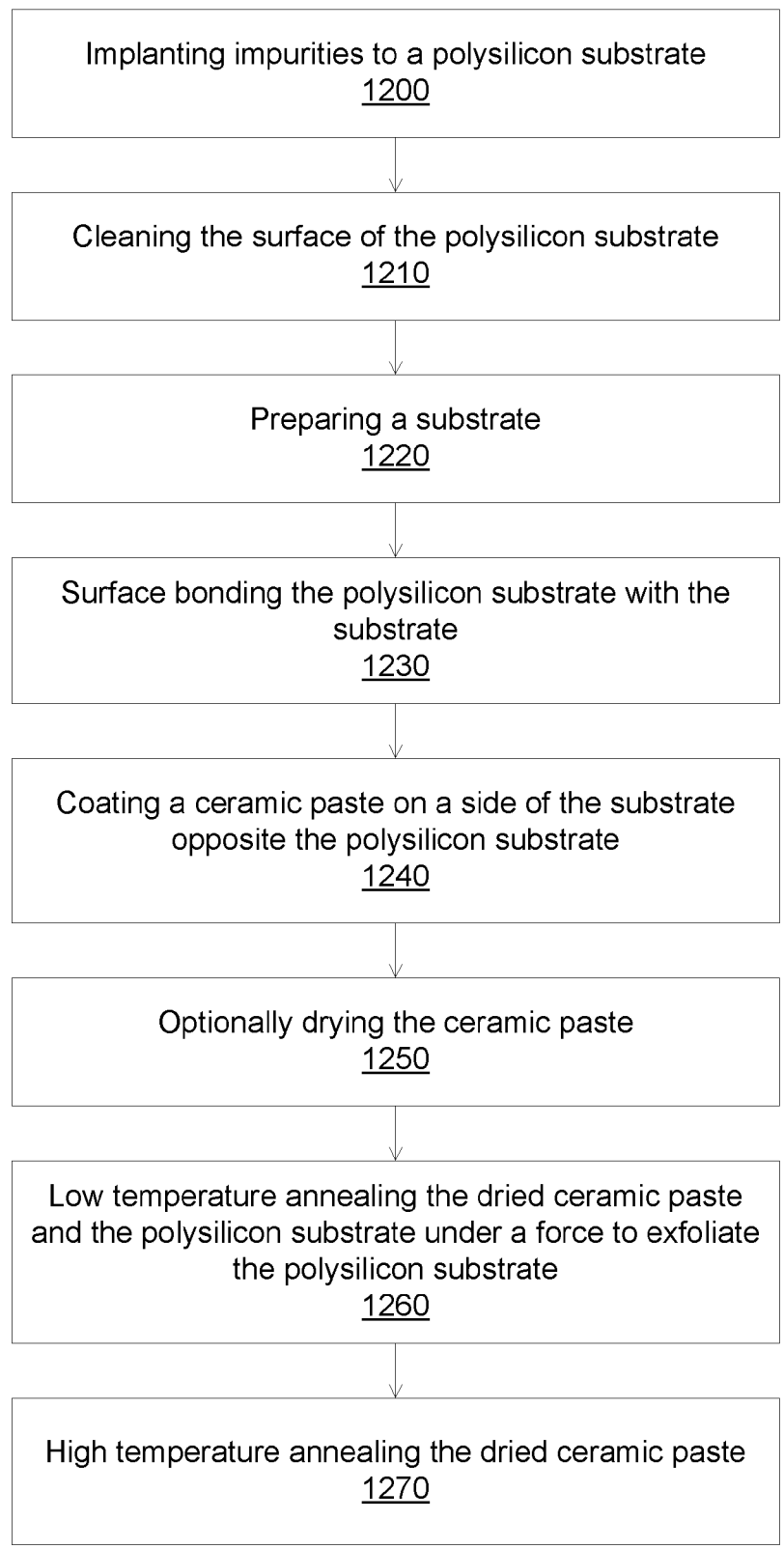
FIG. 12 illustrates a flowchart for fabricating a LGPS substrate according to some embodiments.

FIG. 12 illustrates a flowchart for fabricating a LGPS substrate according to some embodiments. A silicon-containing substrate can be prepared, such as polysilicon substrates. Operation 1200 implants impurities to the silicon-containing substrate. The impurities can include hydrogen and helium. The dose of the impurities can be medium, e.g., enough to provide a defect plane of impurity without separating the surface layer. The energy of the impurities can be elected to provide a defect plane at a depth below the surface of more than 0.3, 0.5, 1, 5, 10, or 20 microns. The substrate can be a bare substrate, e.g., a silicon substrate having a bare silicon surface. The substrate can have an oxide layer on the surface, such as less than 0.1 micron, or less than 10 nm.

Operation 1210 cleans the surface of the silicon-containing substrate. The cleaning can be performed in a dilute HF solution, a SC1 cleaning and/or a SC2 cleaning. In some embodiments, the cleaning process can form a surface with hydrogen or OH terminated bonds.

Operation 1220 prepares a substrate, which can be glass or a glass-ceramic layer. The substrate can be a transparent substrate, a glass substrate, a ceramic substrate such as aluminum oxide, or a composite substrate of multiple layers. The substrate can be cleaned, for example, with HF, SC1 and/or SC2. The substrate can also include oxygen elements, which can exhibit an oxide terminated surface. Also, a cleaning process can prepare the substrate to have a hydrogen or OH terminated surface.

In some embodiments, operation 1220 prepares a transparent glass or glass ceramic substrate.

Operation 1230 bonds the silicon-containing substrate surface with the substrate surface. After cleaning the surfaces of the substrates, the two substrates can be brought together, and the close proximity between the two substrates can form a surface bonding. Hydrogen or OH terminated surfaces can be responsible to the surface bonding between the two substrates.

Operation 1240 optionally coats a layer of ceramic paste to a backside of the substrate. Operation 1250 optionally dries the layer of ceramic paste.

Operation 1260 heats the bonded substrates at a low temperature to exfoliate the silicon-containing substrate. The thermal energy can coalesce the implanted impurities, forming a defect plane that can separate, e.g., exfoliate, the top portion of the surface. The heating process can occur with the bonded substrates under a force, for example, to minimizing the escape of the impurity species.

Operation 1270 optionally anneals the exfoliated substrate together with the substrate at a high temperature to sinter the ceramic paste layer.

In some embodiments, the present invention discloses a LGPS substrate having a polysilicon layer on a handle substrate such as a glass or glass-ceramic substrate, and methods to fabricate such a substrate using a porous silicon process. For example, a thin silicon layer is grown on a polysilicon substrate by epitaxial deposition from silicon-containing gasses such as silane, and tri-chloro-silane, TCS. The thin silicon layer, for example, 1-5 micron, is then etched, for example, by anodic etching in hydrofluoric acid, to form a porous silicon layer. The porous layer structure may contain a single layer of 20-50% porosity, or a two-layer pore structure of 10-30% top layer over a 40-60% porosity layer next to the silicon surface. The structures and processes for producing these pore structure are designed to facilitate the easy exfoliation of the epitaxially grown wafer film. An epitaxially grown polysilicon layer is then disposed on the porous silicon layer, and can be of any desired thickness, ranging from less than a micron to 50 μm. The pore structures undergo great changes at the high temperature silicon growth temperatures in the presence of hydrogen and silicon containing gas, with the low porosity layer completely bridging to from good single crystal silicon surface for epitaxially growth of silicon, while high porosity layer bridged coalesces to nearly completely porous regions with isolated silicon pillars tenuously attaching the epitaxial wafer to the growth wafer.

The thin silicon wafer film, weakly bonded to the thicker silicon growth substrate, is used for bonding with a handle substrate, such as a glass or glass-ceramic substrate.

Figure 13A:
FIGS. 13A-13F illustrate a process to form a LGPS substrate using an exfoliate process on a porous silicon substrate according to some embodiments.
Figure 13B:
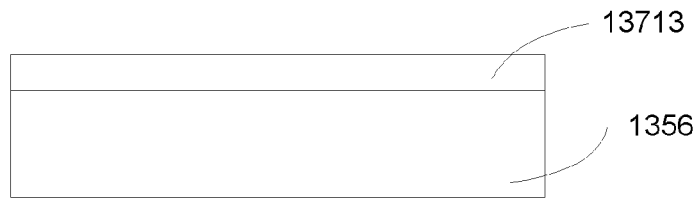
Figure 13C:
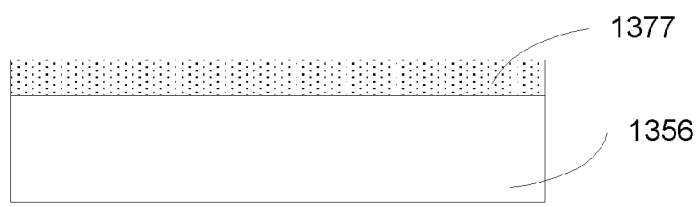
Figure 13D:
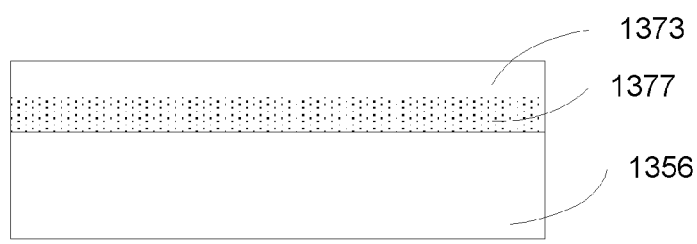
Figure 13E:
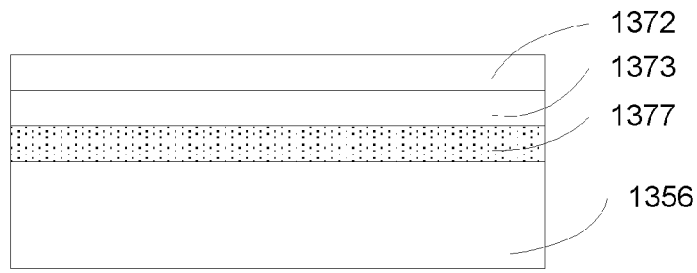
Figure 13F:
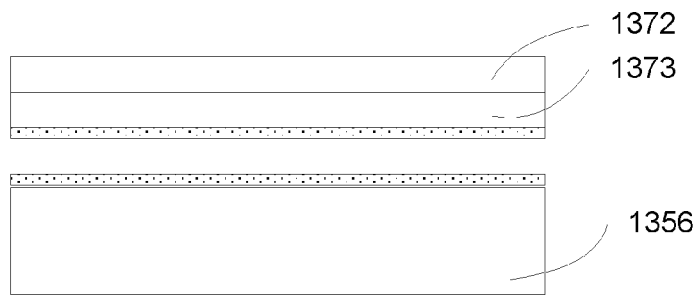

FIGS. 13A-13F illustrate a process to form a LGPS substrate using an exfoliate process on a porous silicon substrate according to some embodiments. In FIG. 13A, a polysilicon substrate 56 is provided. A thin silicon layer 1379 is deposited (e.g., epitaxially deposited) on the polysilicon substrate 56, preferably having impurities to facilitate a subsequent wet etch process (FIG. 13B). An etch process, such as a wet etch process, and preferably an anodic etch process, is performed on the deposited silicon layer 1379. Defects are preferentially etched, creating a porous silicon layer 1377 (FIG. 13C). Small pores at the surface are preferred, to facilitate a subsequent epitaxial silicon deposition, with the remaining silicon on the surface serving as seed sites. Larger pores underneath the surface are preferred, to facilitate a subsequent exfoliation process. Multiple silicon layers 1379 can be deposited with different defect densities, to create multiple layers having different pore densities. In FIG. 13D, a second epitaxial silicon layer 1373 is deposited on the porous silicon layer 1377. The silicon substrate is then bonded to a handle substrate, such as a glass or glass-ceramic substrate 1372 (FIG. 13E). The thermal expansion mismatch can exfoliate the silicon substrate at the defect region of porous silicon layer 1377, creating a composite substrate having a polysilicon layer on a glass or glass-ceramic substrate, and a remaining silicon substrate (FIG. 13F). An optional cleaning process can be performed to clean the remaining porous silicon layer.

Other processes to form a porous silicon layer can be used, such as an impurity implantation and wet etch to remove impurities, or a patterning process.

Figure 14:
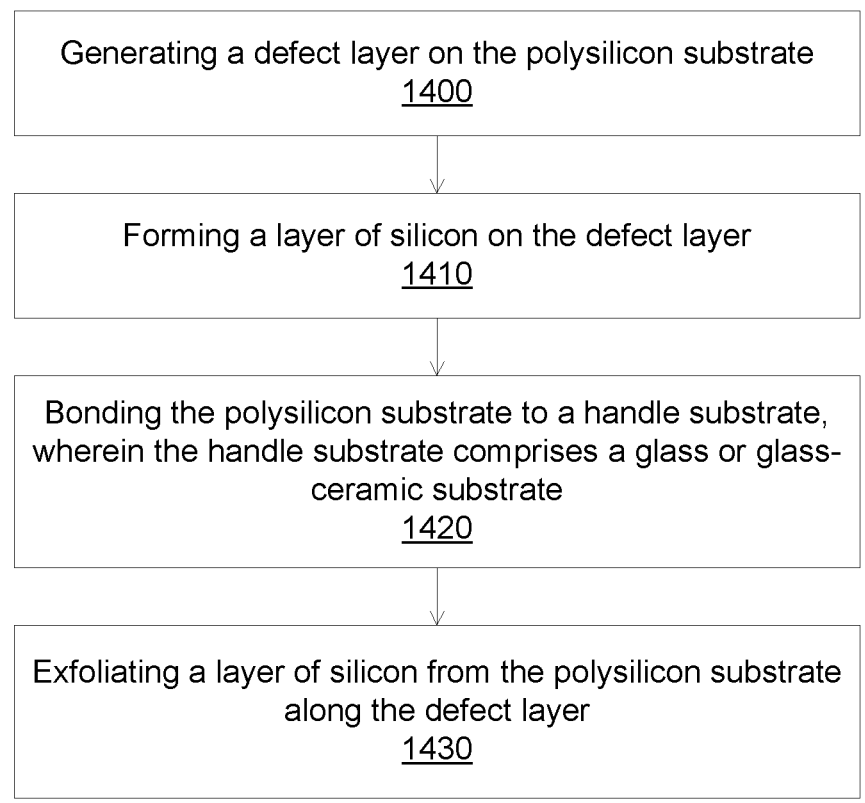
FIG. 14 illustrates a flow chart for forming a LGPS substrate according to some embodiments.

FIG. 14 illustrates a flow chart for forming a LGPS substrate according to some embodiments. Operation 1400 generates a defect layer on the polysilicon substrate. Operation 1410 forms a layer of silicon on the defect layer. Operation 1420 bonds the polysilicon substrate to a handle substrate, wherein the handle substrate comprises a glass or glass-ceramic substrate. Operation 1430 exfoliates a layer of silicon from the polysilicon substrate along the defect layer.

Figure 15A:
FIGS. 15A-15E illustrate another process to form a polysilicon layer on a handle substrate using an exfoliate process on a porous silicon substrate according to some embodiments.
Figure 15B:
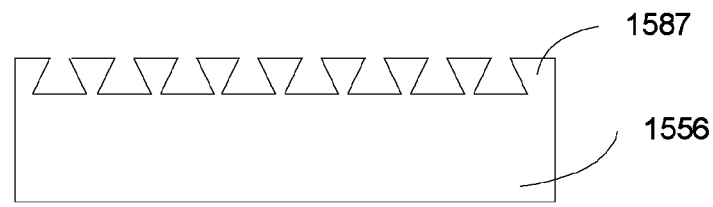
Figure 15C:
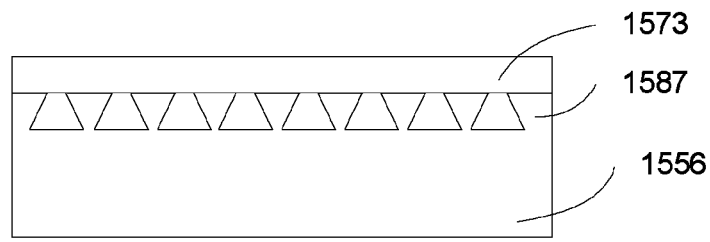
Figure 15D:
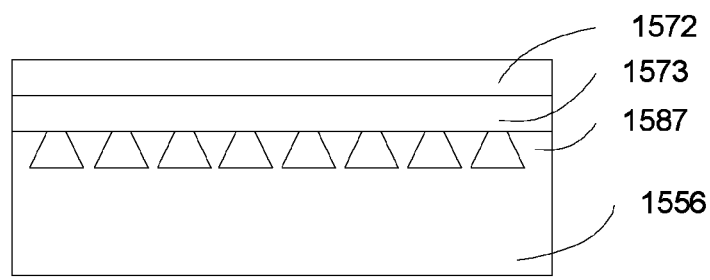
Figure 15E:
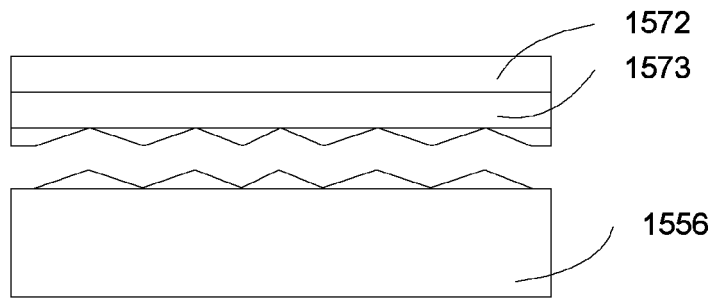

FIGS. 15A-15E illustrate another process to form a polysilicon layer on a handle substrate using an exfoliate process on a porous silicon substrate according to some embodiments. In FIG. 15A, a polysilicon substrate 1556 is provided. A patterning process, such as a wet etch process utilizing a lithography mask, is performed on the surface of the silicon substrate 1556. The etch pattern can be tapers, larger at the bottom and smaller at the top near the silicon surface, creating a patterned silicon layer 1587 (FIG. 15B). Small openings at the surface are preferred, to facilitate a subsequent epitaxial silicon deposition, with the remaining silicon on the surface serving as seed sites. Larger openings underneath the surface are preferred, to facilitate a subsequent exfoliation process. In FIG. 15C, a second epitaxial silicon layer 1573 is deposited on the patterned silicon layer 1587. The silicon substrate is then bonded to a handle substrate, such as a glass or glass-ceramic substrate 1572 (FIG. 15D). The thermal expansion mismatch can exfoliate the silicon substrate at the defect region of patterned silicon layer 1587, creating a composite substrate having a polysilicon layer on a glass substrate, and a remaining silicon substrate (FIG. 15E). An optional cleaning process can be performed to clean the remaining patterned silicon layer.

Figure 16:
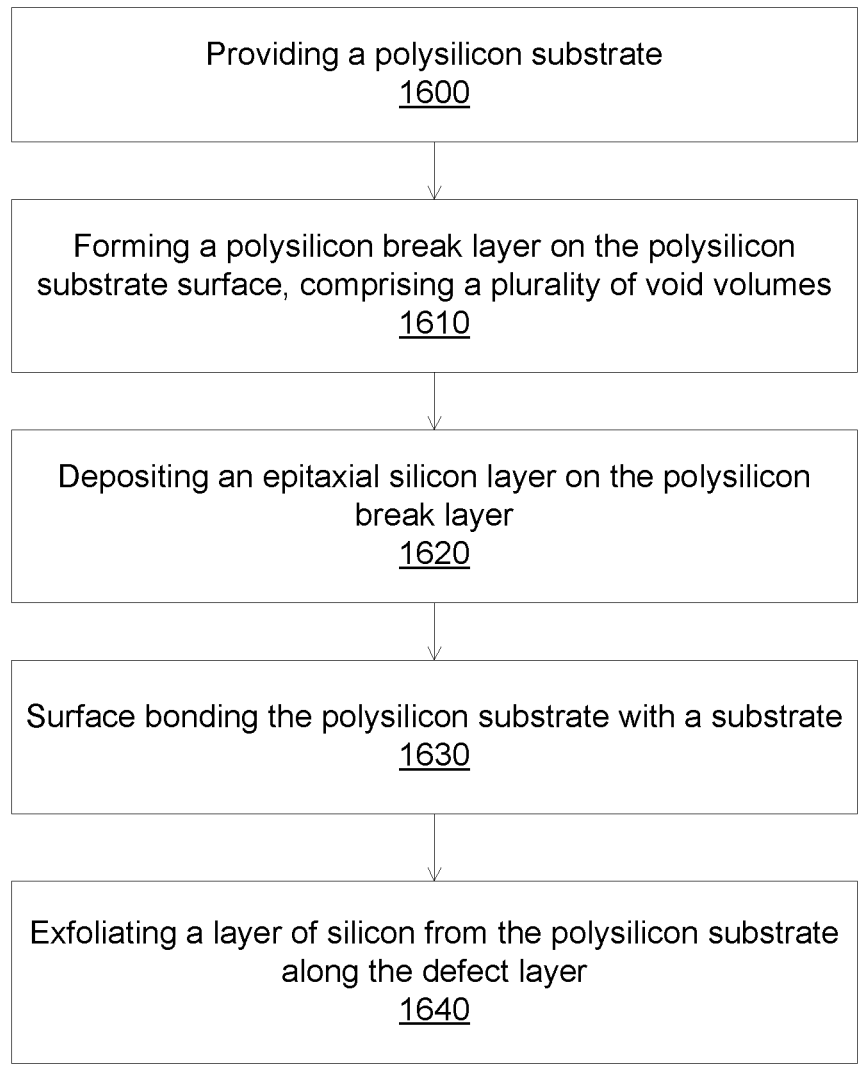
FIG. 16 illustrates a flow chart for forming a LGPS substrate according to some embodiments.

FIG. 16 illustrates a flow chart for forming a LGPS substrate according to some embodiments. Operation 1600 provides a polysilicon substrate. Operation 1610 forms a polysilicon break layer on the polysilicon substrate surface, comprising a plurality of void volumes. Operation 1620 deposits a silicon layer, such as an epitaxial silicon layer, on the polysilicon break layer. Operation 1630 surface bonds the polysilicon substrate with a substrate, such as a glass or glass-ceramic substrate. Operation 1640 exfoliates a layer of silicon from the polysilicon substrate along the defect layer.

In some embodiments, the present invention discloses methods, and substrates resulting from the methods, to form a silicon on glass substrate, for example, by transferring through exfoliation a portion of a silicon substrate (single crystal or polycrystalline silicon substrate) onto a glass substrate. After transferring, the silicon substrate can be cleaned and polished, ready for another transfer.

In some embodiments, the present invention discloses methods to re-use the silicon substrate by selective implantation, which can result in selective exfoliation of portions of the silicon substrate. Thus different portions of the silicon substrate can be selectively implanted, until the surface of the silicon substrate is completely utilized, before the silicon substrate will need to be cleaned and polished.

In some embodiments, the present invention discloses patterned exfoliation processes of single crystal silicon wafers onto display glass for creating silicon mesas for thin film transistors to create mobile display backplanes.

In creating thin film transistors on glass for display backplanes, the semiconductor medium is first formed as a monolithic coating on the glass by a suitable deposition method, and thereafter, mostly etched-off leaving behind isolated semiconductor regions for forming the transistors and capacitor structures. The pixels areas are mostly devoid of the semiconductor, up to as much as 70%, these bare areas defining the pixel aperture. This is how a-Si, LIPS, and oxide backplanes are formed.

Single crystal silicon transistors on glass has been used in the past for creating very high quality backplanes in one of two ways, as follows:

a. First a blanket single crystal silicon layer, 50-500 nm thick, is exfoliated on to display glass by whole area ion-implant followed by bonding and exfoliation on to glass. This is followed by the creation of silicon mesas in which transistor and other structures are formed.

b. Less commonly, the transistors are first created on silicon wafers by a regular CMOS processes in a fab, and these are then transferred to a display glass, by blanket ion-implant—bonding to and exfoliation on to glass. The silicon areas not required for transistor creation are then removed by masking and etching.

In both cases, one needs to recreate the surface of the 'mother silicon' before it can be used to create the next backplane layer by repeating ion-implant/exfoliation.

In case a, the silicon surface has to be polished by chem-mechanical methods, and often also needs thermal oxidation step.

In case b, the next batch of transistors also needs to be created before ion implant and exfoliation and transfer to glass.

In some embodiments, patterned or selective exfoliation can be used to enable using the same wafer surface many times over for backplane creation.

This invention incorporates the very important ideas using selective implant/exfoliation, with calibrated lateral translation to greatly enhance silicon availability, and cost reduction in fabrication of single crystal silicon backplanes.

In both cases a and b, the resist openings used to define silicon surface areas to be subject to exfoliation, are translated laterally, to a defined next area of interest, either in bare silicon areas for case a, and device areas for case b in both cases the same silicon area may be used many times over, before the entire surface has be polished off to start the process over again.

This invention enables one to multiply silicon surface used to create the single crystal silicon backplanes. Let us say, in practice we can create, say 10 such surface translations, 10 will be our surface multiplier.

Since each wafer can lend itself, say up to 20 or more sequential surface exfoliations, we enhance the use of scarce silicon wafers by 20×10=200.

This invention is important not only to reducing cost, and more importantly, to conserve the single crystal silicon wafers. This is very important because of the sheer numbers of Smartphone the world needs every year, approaching billions/year.

In some embodiments, the present invention discloses a selective implantation, which can lead to a selective exfoliation. A ion mask can be formed on a silicon substrate, e.g., a single crystal silicon substrate or a polycrystalline silicon substrate. The silicon substrate is then subjected to an ion implantation process, which can form a defect plane at the opening portion of the ion mask. The ion implantation species do not penetrate the ion mask, so at the areas of the ion mask, there is no corresponding defect plane in the silicon substrate. The ion mask can be a resist mask, formed by photolithography. After the implantation process, the ion mask is stripped, and the silicon substrate can be bonded to a handle substrate, such as a glass or glass ceramic substrate. The portion of the silicon substrate having the defect plane can be exfoliated on the handle substrate, leaving the rest of the silicon substrate intact.

Figure 17A:
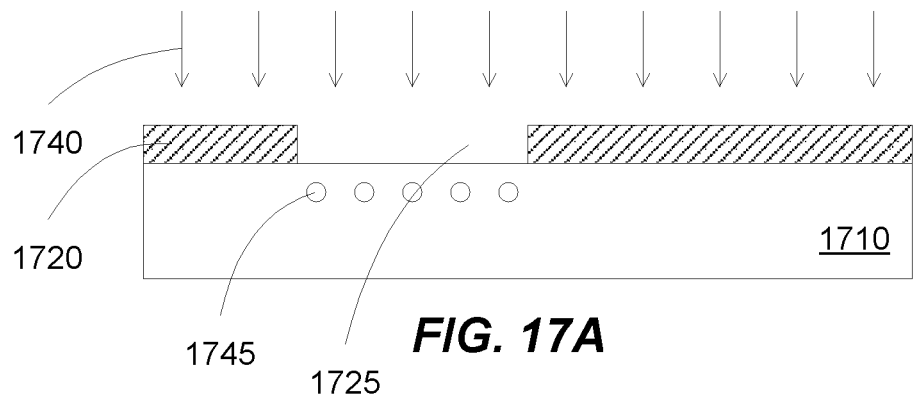
FIGS. 17A-17D illustrate a selective exfoliation process according to some embodiments.
Figure 17B:
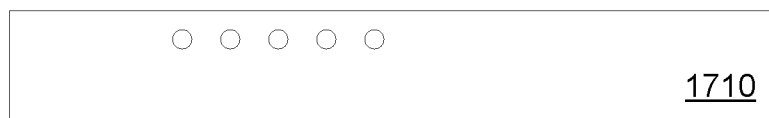
Figure 17C:
Figure 17D:
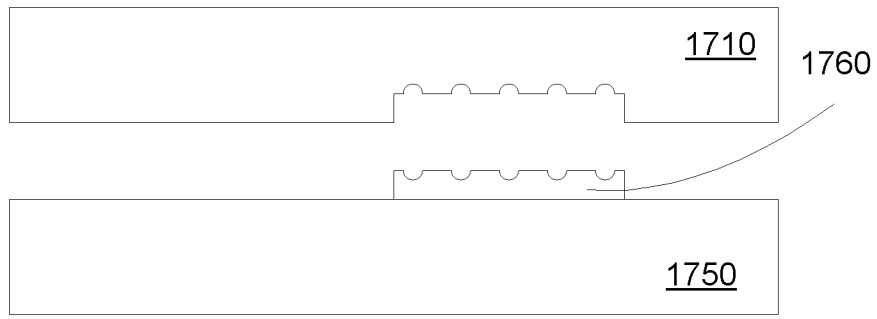

FIGS. 17A-17D illustrate a selective exfoliation process according to some embodiments. In FIG. 17A, a mask 1720 can be formed on a silicon substrate 1710, such as a single crystal or a polycrystalline silicon substrate. The mask 1720 can include openings 1725, e.g., areas in which there is no mask. The substrate is then subjected to an ion implantation process 1740. The ion implantation species can form a defect plane 1745 in the silicon substrate, at the opening areas 1725 of the mask 1720. In FIG. 17B, the mask is removed. In FIG. 17C, the silicon substrate 1710 can be bonded to a handle substrate 1750, such as a glass or glass-ceramic substrate. In FIG. 171.3, an exfoliation process is performed, and a portion 1760 of the silicon substrate is exfoliated onto the handle substrate 1750.

FIGS. 18A-18B illustrate flow charts for selective exfoliation according to some embodiments. In FIG. 18A, operation 1800 selective implants a portion of a silicon substrate, wherein the silicon substrate comprises a single crystal silicon or a polysilicon substrate. Operation 1810 exfoliates the portion of the silicon substrate on a handle substrate.

In FIG. 18B, operation 1830 forms a mask on a silicon substrate, wherein the silicon substrate comprises a single crystal silicon or a polysilicon substrate. Operation 1840 ion implants the silicon substrate through the mask. Operation 1850 removes the mask. Operation 1860 exfoliates a portion of a silicon layer on a handle substrate, wherein the silicon layer is formed by the mask.

In some embodiments, the selective exfoliation process can allow the silicon substrate to be re-used until all surface area of the silicon substrate is completed transferred. Further the selective exfoliation process can allow a transfer silicon portions from the silicon substrate to the handle substrate at different pitches.

Figure 19:
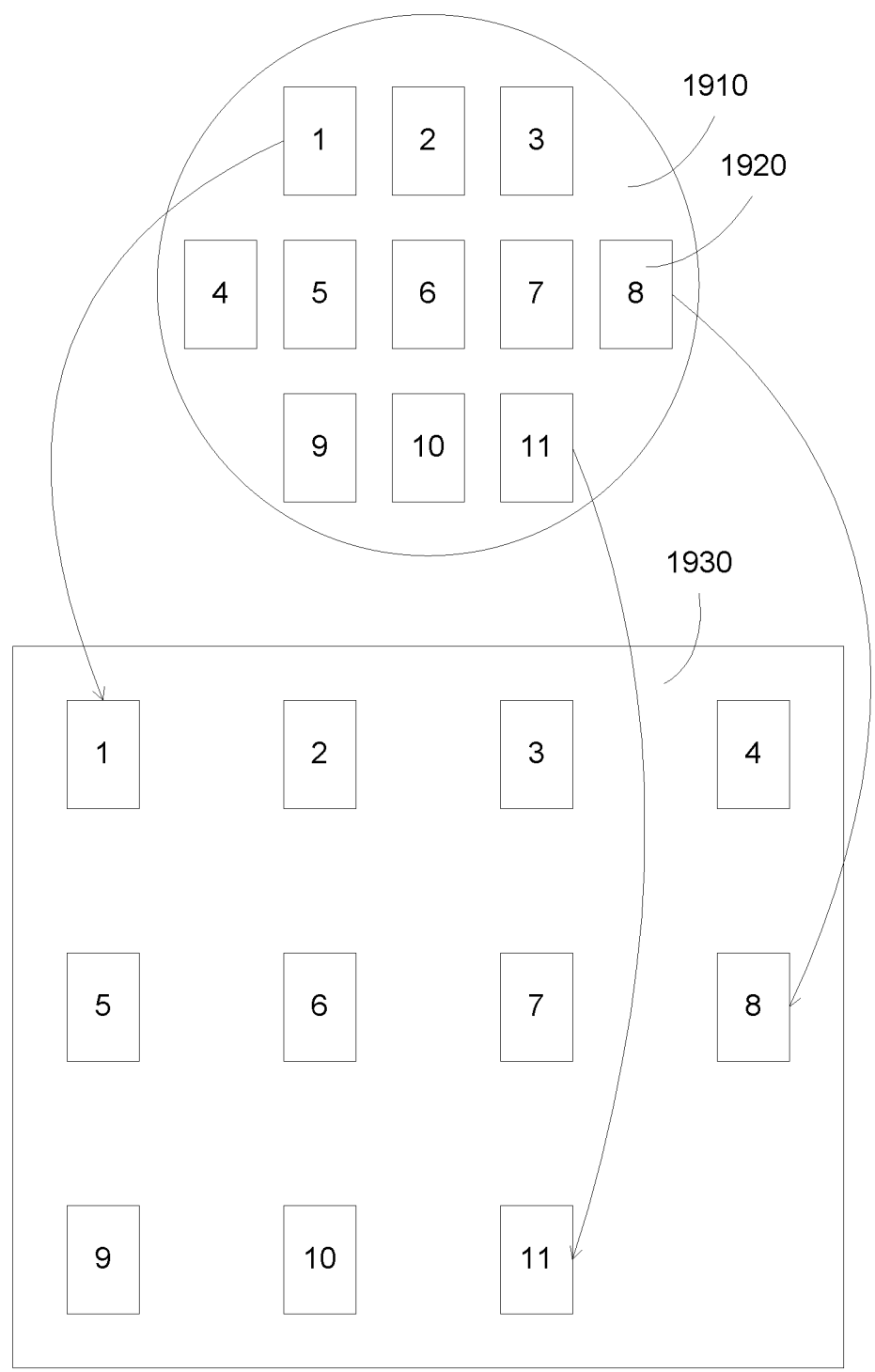
FIG. 19 illustrates a sequential transferring process from a silicon substrate to a handle substrate according to some embodiments.

FIG. 19 illustrates a sequential transferring process from a silicon substrate to a handle substrate according to some embodiments. Silicon portions 1920 (labeled 1-11) in a silicon substrate 1910 can be individually sequentially transferred, by selective exfoliation, to a handle substrate 1930. The pitch of the silicon portions can be different in the silicon substrate 1910 from the pitch in the handle substrate 1930.

The silicon substrate can be a single crystal silicon substrate, as shown. Alternatively, the silicon substrate can be a polysilicon substrate.

Figure 20:
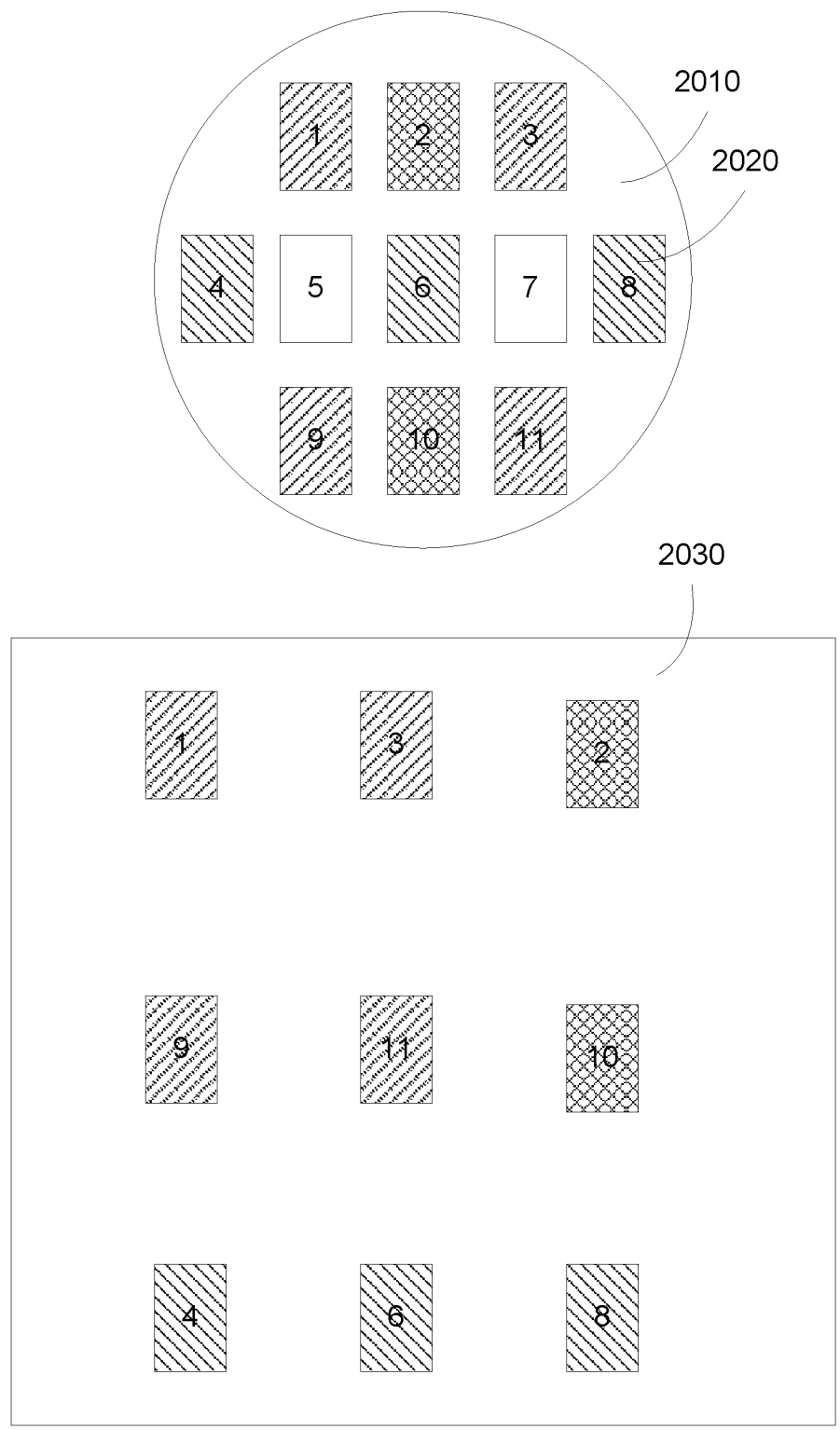
FIG. 20 illustrates another sequential transferring process from a silicon substrate to a handle substrate according to some embodiments.

FIG. 20 illustrates another sequential transferring process from a silicon substrate to a handle substrate according to some embodiments. Silicon portions 2020 (labeled 1-11) in a silicon substrate 2010 can be sequentially transferred, by selective exfoliation, to a handle substrate 2030. Multiple portions can be transferred at a same time. For example, portions 1, 3, 9, 11; portions 4, 6, 8; and portions 2, 10 can be transferred together. The pitch of the silicon portions can be different in the silicon substrate 2010 from the pitch in the handle substrate 2030.

FIGS. 21A-21B illustrate flow charts for selective transfer according to some embodiments. In FIG. 21A, operation 2100 transfers multiple portions of a silicon substrate to a handle substrate, wherein the pitch of the multiple portions in the silicon substrate is different from the pitch in the handle substrate.

In FIG. 21B, operation 2120 exfoliates one or more portions of a silicon substrate to a handle substrate. Operation 2130 repeatedly exfoliates another one or more portions.

In some embodiments, the present invention discloses structures and methods for thin exfoliated silicon layer on glass with good field stitching.

Semiconductor backplanes for AMOLED using single crystal silicon on glass (SiOG) is limited to available sizes of single crystal silicon wafers. The process for forming thin single crystal silicon layers involves ion implanting hydrogen into the surface of the polished silicon wafers to a desired depth, usually a micron or less, cleaning the wafer surface to make it hydrophilic, attaching it to the very clean glass surface, and heating to exfoliate the thin silicon layer to the glass. In practice, several H-implanted wafers are placed in a close packed array and exfoliated simultaneously on to the large display glass to be ready for processing into backplanes for high performance phone displays. Since, one or more display panels are processed on each squared or rectangular SiOG area on the glass, it was acceptable to have spaces in between them, in days before 2007 when SiOG was first developed by Corning. It was all right to make a display fab line solely dedicated to small phone displays.

Today, we see the sizes of portable displays, such as I-Pods, and so-called Phablets, even of Smartphone displays are growing. For reasons of economics and other reasons, display panel fabs would like to process many different sizes of portable displays on the same line. This was possible for other types of semiconductors, which are coated as monolithic coatings on glass. The wafer size limitations of SiOG will be seen as a serious limitation for this important backplane technology.

This invention is aimed to overcoming this problem. It will enable forming 'continuous' SiOG layers on glass by providing for some overlap between adjacent wafer exfoliations. Since for exfoliation on to glass, it is required for the H-implanted wafers to be in almost atomic contact with the glass surface, the finite thickness of the wafers, hundreds of microns, would frustrate such contact. By providing a conformal loading, a better contact can be formed between the silicon substrate and the glass substrate. The improved contact can allow the silicon portion to be exfoliated right at the edge of a prior exfoliated silicon portion.

In some embodiments, conformal loading means "no air gaps between mating surfaces". This can be achieved by having something like a foam or sponge between the mating surfaces. If the substrate surface has surface features like grain boundaries, or gaps between the tiled portions, this will make it possible to exert the needed pressure evenly.

Figure 22A:
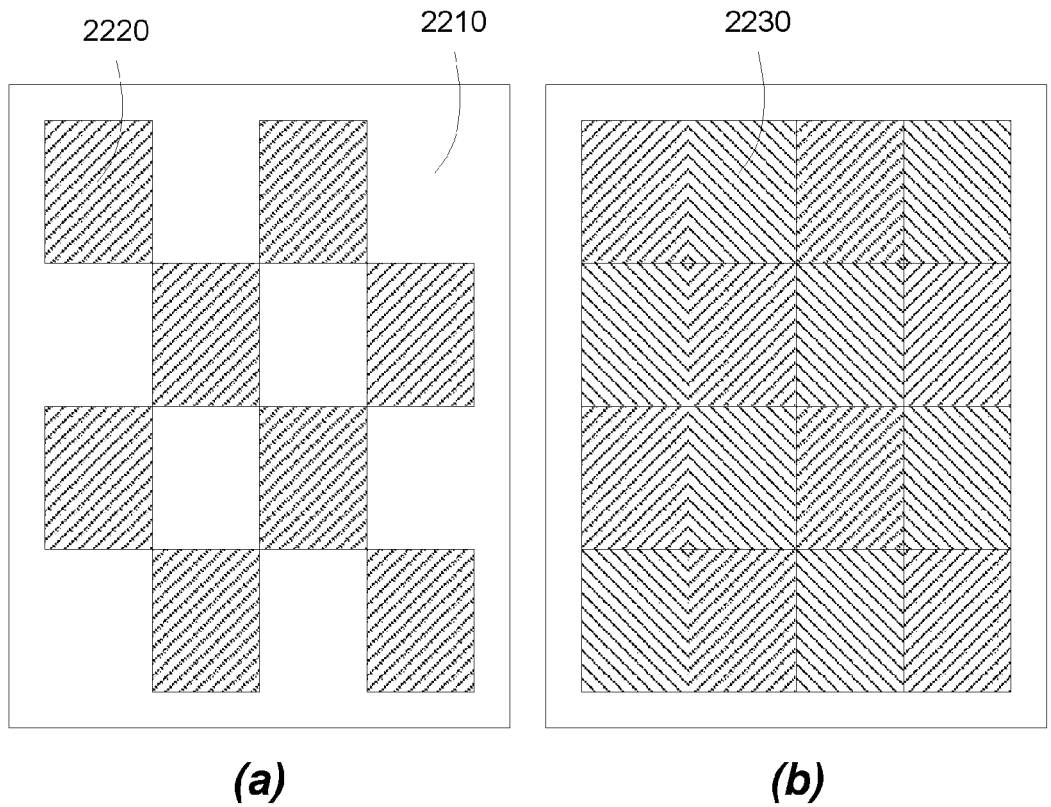
FIGS. 22A-22B illustrate a process for forming exfoliated portions according to some embodiments.
Figure 22B:
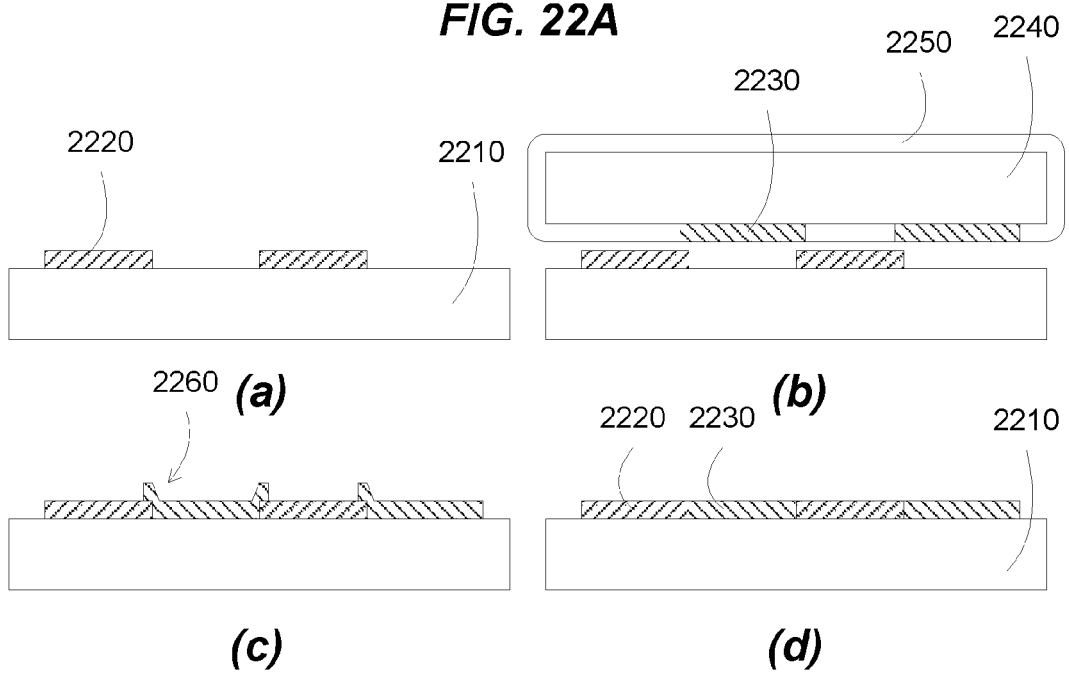

FIGS. 22A-22B illustrate a process for forming exfoliated portions according to some embodiments. FIGS. 22A(a)-(b) show top views of the process. FIGS. 22B (a)-(d) show cross sections of the process.

In FIGS. 22A(a), a first exfoliation can be performed, forming silicon portions 2220 on a handle substrate 2210. The silicon portions 2220 can form a checker board configuration. In FIG. 22A(b), a second exfoliation can be performed, using a conformal loading process of the silicon portions 2230, to form a complete exfoliation substrate without field stitching.

In FIG. 22B(b), a first exfoliation can be performed, forming silicon portions 2220 on a handle substrate 2210. In FIG. 22B(b), a second exfoliation can be performed, using a conformal loading process of the silicon portions 2230. The silicon portions 2230 can be slightly larger than the corresponding areas on the handle substrate 2210. In FIG. 22B(c), the silicon portions 2230 can be exfoliated right to the edges of the previously exfoliated silicon portions 2220, due to the conformal loading. In FIG. 22B(d), excess silicon 2260 from the silicon portions 2230 can be cleaned or polished off.

FIGS. 23A-23C illustrate flow charts for forming silicon on glass according to some embodiments. In FIG. 23A, operation 2200 exfoliates a portion of a silicon substrate on a handle substrate using a conformal loading.

In FIG. 23B, operation 2200 exfoliates a first portion of a silicon substrate on a handle substrate, wherein the portion is disposed near a second silicon portion on the handle substrate, wherein the exfoliating process is configured so that the first and second portions are placed edges to edges.

In FIG. 23C, operation 2240 exfoliates a first portion of a first silicon substrate to a handle substrate. Operation 2250 exfoliates a second portion of a second silicon substrate on the handle substrate, wherein the second portion is disposed near the first portion, wherein a conformal loading is used in the exfoliating process. Operation 2260 removes overlap portions from the first and second portions.

What is claimed is:

1. A method comprising
providing a polysilicon substrate;
forming a defect plane under the polysilicon substrate to separate a polysilicon layer from a polysilicon substrate body;
bonding the polysilicon substrate to a glass or glass-ceramic substrate;
exfoliating the polysilicon layer onto the glass or glass-ceramic substrate.

2. A method as in claim 1
wherein the defect plane is formed by an ion implantation process.

3. A method as in claim 1
wherein the defect plane is formed by forming a porous layer, followed by depositing the polysilicon layer on the porous layer.

4. A method as in claim 1
wherein the defect plane is formed by partially etching a surface layer of the polysilicon substrate, followed by depositing the polysilicon layer on the etched surface layer.

5. A method as in claim 1
wherein the defect plane is formed by depositing a layer, followed by partially etching a deposited layer to form a porous layer, and followed by depositing the polysilicon layer on the porous layer.

6. A method as in claim 1
wherein the polysilicon substrate is formed by slicing a polysilicon block, wherein the polysilicon block comprises melted silicon that is gradually cooled down to form large grain polysilicon.

7. A method as in claim 1 further comprising
applying a ceramic paste to the glass or glass-ceramic substrate.

8. A method as in claim 1
wherein the defect plane is formed by a selective ion implantation process.

9. A method as in claim 1
wherein the defect plane is formed by forming a mask on the polysilicon substrate, followed by an ion implantation process on the mask.

10. A method as in claim 1
wherein the exfoliation process comprises a conformal loading process.

* * * * *